(12) United States Patent
Abiko et al.

(10) Patent No.: US 10,355,122 B2
(45) Date of Patent: Jul. 16, 2019

(54) SEMICONDUCTOR DEVICE AND METHOD OF MANUFACTURING THE SEMICONDUCTOR DEVICE

(71) Applicant: Renesas Electronics Corporation, Koutou-ku, Tokyo (JP)

(72) Inventors: Yuya Abiko, Ibaraki (JP); Satoshi Eguchi, Ibaraki (JP); Shigeaki Saito, Ibaraki (JP); Daisuke Taniguchi, Ibaraki (JP); Natsuo Yamaguchi, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/640,375

(22) Filed: Jun. 30, 2017

(65) Prior Publication Data

US 2018/0076313 A1    Mar. 15, 2018

(30) Foreign Application Priority Data

Sep. 9, 2016  (JP) ................... 2016-177033

(51) Int. Cl.
*H01L 29/06*     (2006.01)
*H01L 29/08*     (2006.01)
(Continued)

(52) U.S. Cl.
CPC ...... *H01L 29/7802* (2013.01); *H01L 29/0634* (2013.01); *H01L 29/0878* (2013.01);
(Continued)

(58) Field of Classification Search
CPC ................................. H01L 29/7802
See application file for complete search history.

(56) References Cited

U.S. PATENT DOCUMENTS 8,097,511 B2    1/2012  Shibata et al.
2006/0197152 A1*  9/2006  Tokano ............... H01L 29/0634
                                                  257/341

(Continued)

FOREIGN PATENT DOCUMENTS

DE    10 2004 024 344 A1    12/2005
JP        2008-305927 A     12/2008

OTHER PUBLICATIONS

Extended European search report for European Patent Application No. 17181817.2, dated Feb. 2, 2018.

*Primary Examiner* — William A Harriston
(74) *Attorney, Agent, or Firm* — Shapiro, Gabor and Rosenberger, PLLC

(57) ABSTRACT

Properties of a semiconductor device are improved. A semiconductor device having a superjunction structure, in which p-type column regions and n-type column regions are periodically arranged, is configured as follows. Each n-type column region has a vertical section including an n-type epitaxial layer located between trenches and a tapered embedded n-type epitaxial film disposed on a side face of the trench. Each p-type column region includes an embedded p-type epitaxial film disposed within the trench. The tapered embedded n-type epitaxial film is thus provided on the sidewall of the trench in which the p-type column region is to be disposed, thereby the p-type column region is allowed to have an inverted trapezoidal shape, leading to an increase in margin for a variation in concentration of a p-type impurity in the p-type column region. On resistance can be reduced by lateral diffusion of an n-type impurity (for example, As).

7 Claims, 36 Drawing Sheets

(51) Int. Cl.
    *H01L 29/66*     (2006.01)
    *H01L 29/78*     (2006.01)
    *H01L 21/22*     (2006.01)
    *H01L 21/225*     (2006.01)
    *H01L 29/861*     (2006.01)

(52) U.S. Cl.
    CPC .... *H01L 29/66712* (2013.01); *H01L 21/2205* (2013.01); *H01L 21/2251* (2013.01); *H01L 21/2253* (2013.01); *H01L 29/0886* (2013.01); *H01L 29/7811* (2013.01); *H01L 29/8611* (2013.01)

(56) References Cited

U.S. PATENT DOCUMENTS

| | | |
|---|---|---|
| 2007/0082455 A1 | 4/2007 | Nogami et al. |
| 2008/0211020 A1 | 9/2008 | Saito |
| 2013/0087851 A1 | 4/2013 | Kagata et al. |
| 2015/0108620 A1 | 4/2015 | Weber |
| 2016/0204192 A1* | 7/2016 | Abiko ............... H01L 29/66727 257/341 |

* cited by examiner

FIG. 10A
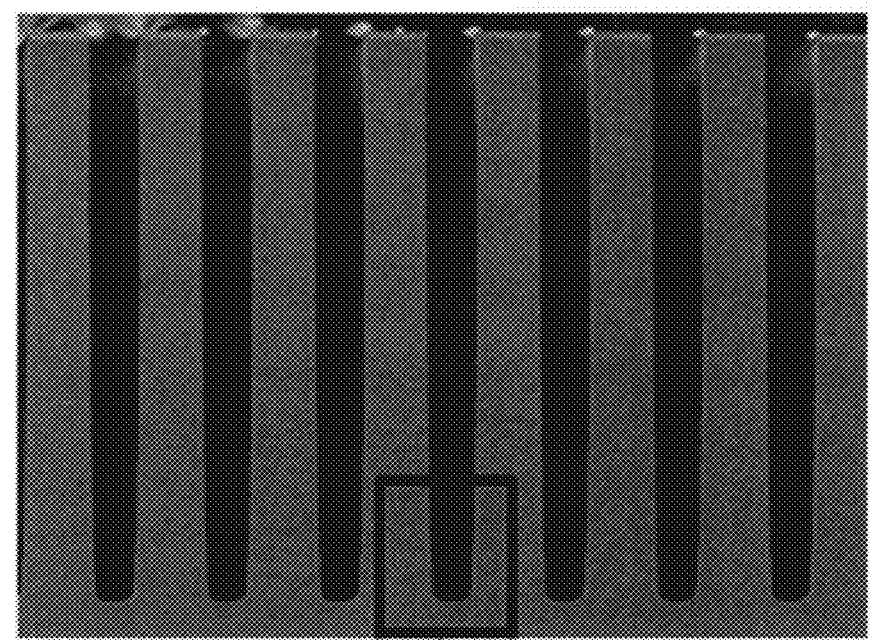
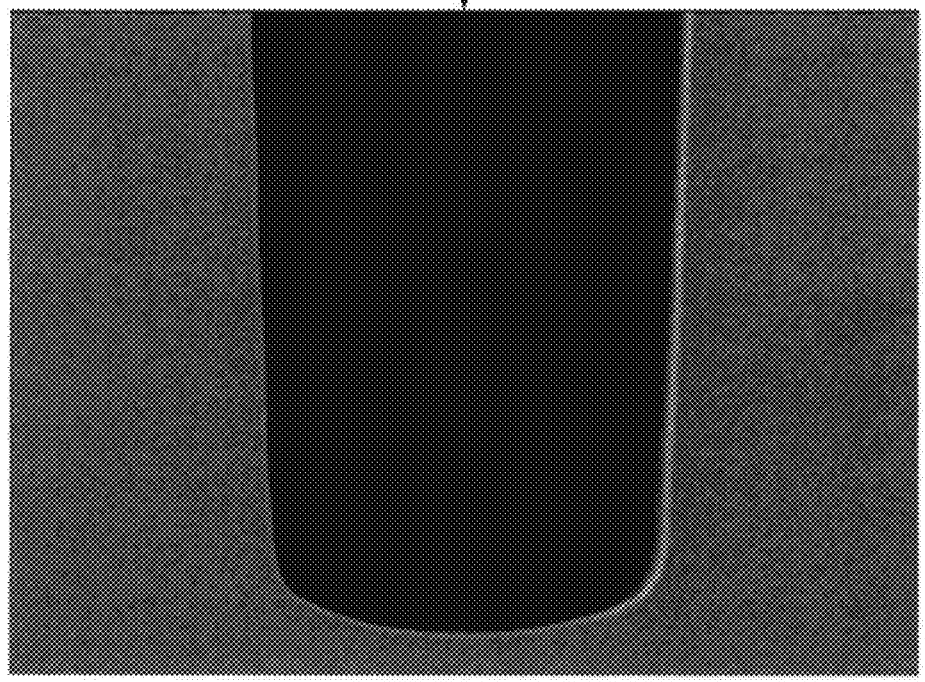
FIG. 10B

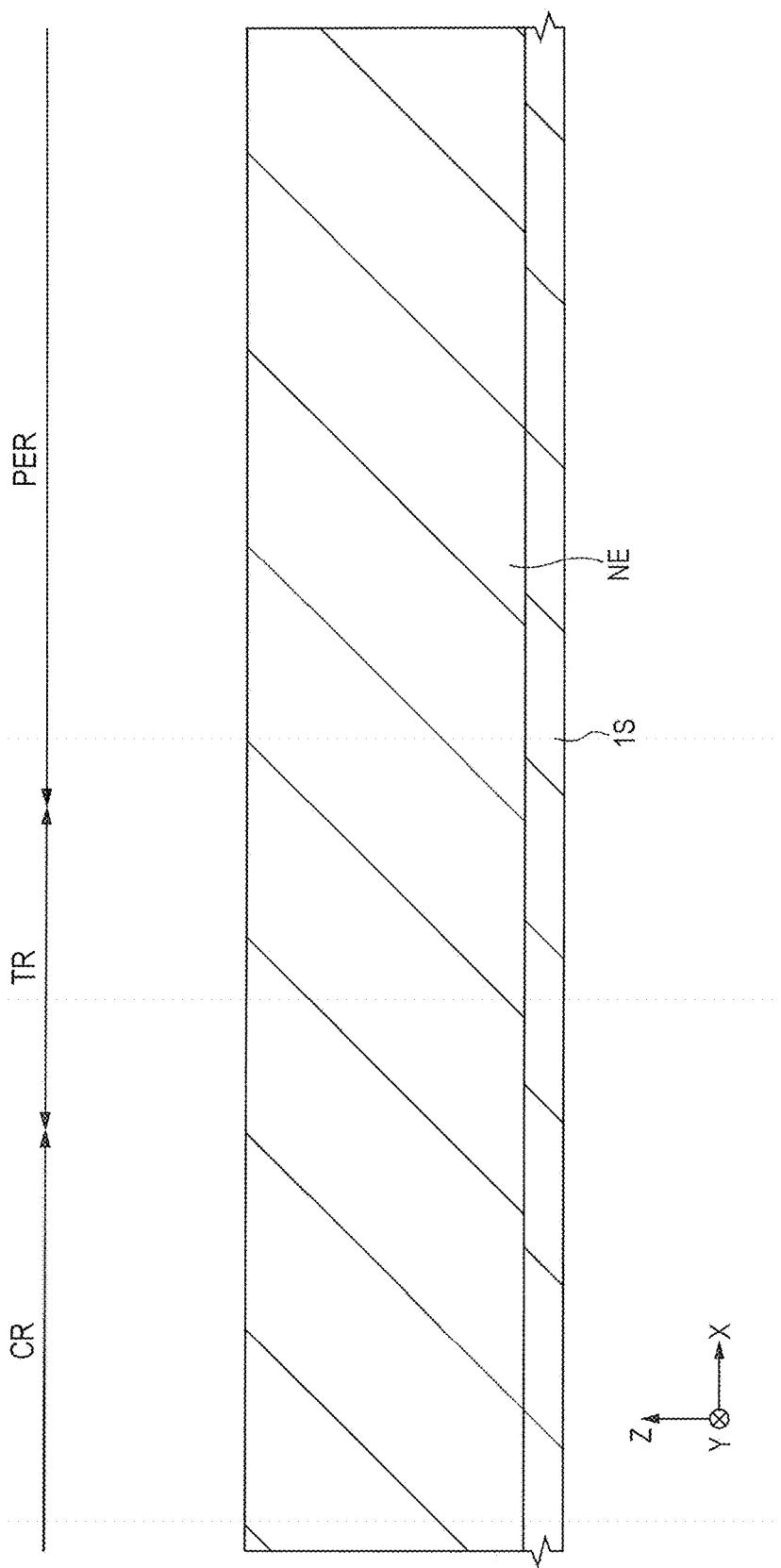

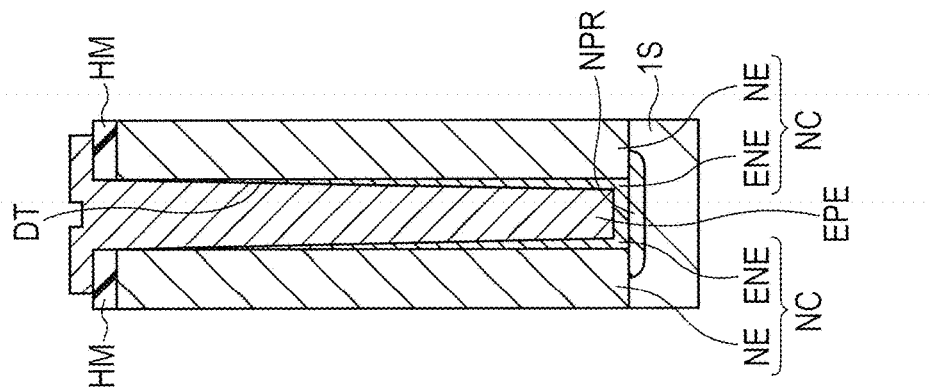
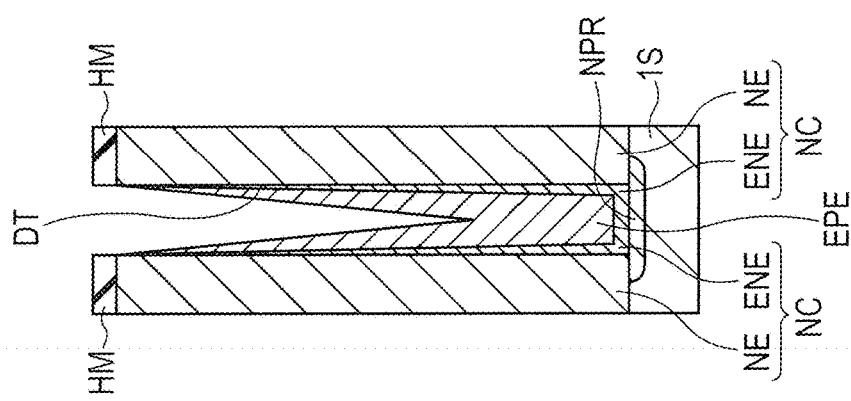
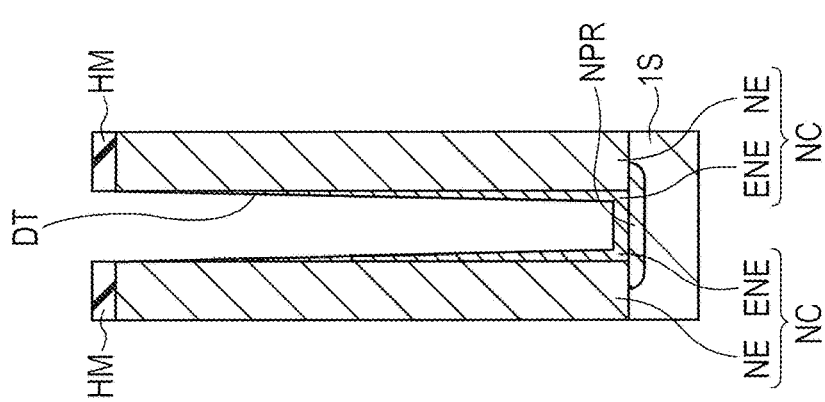
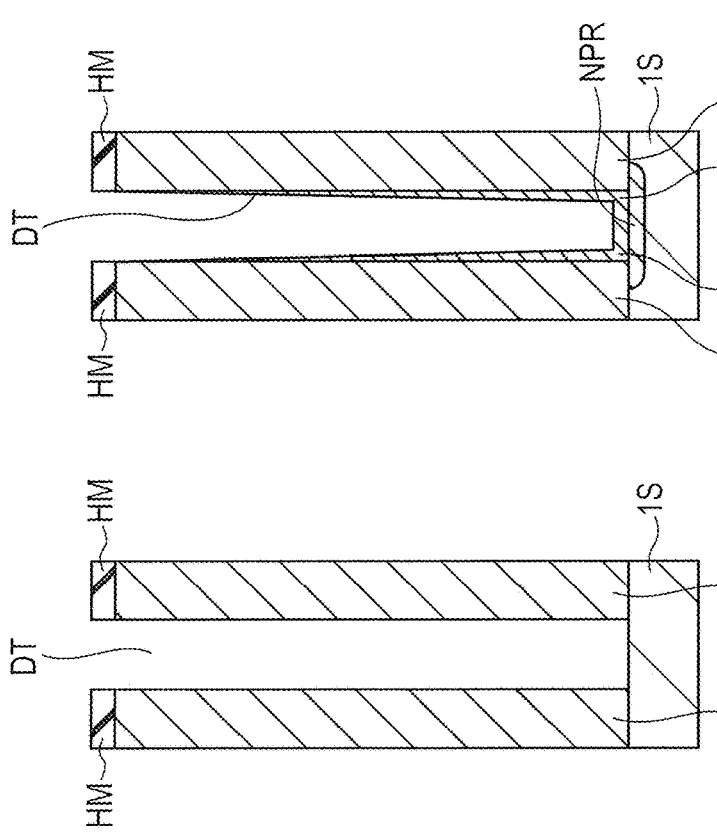

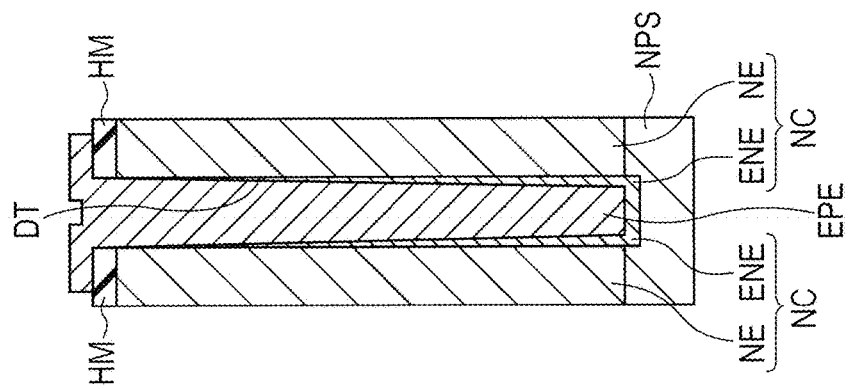
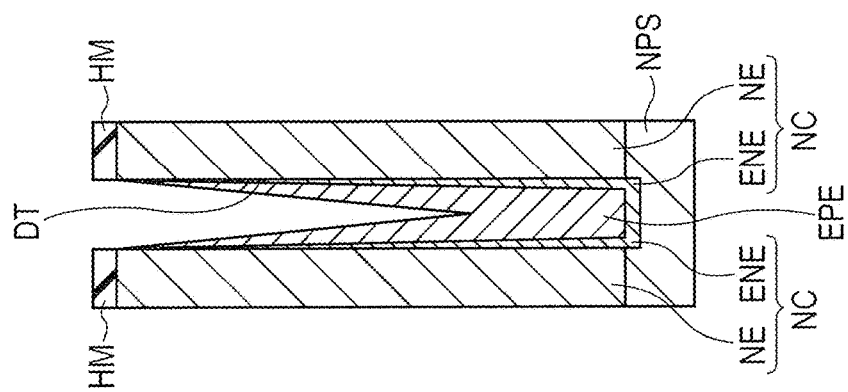
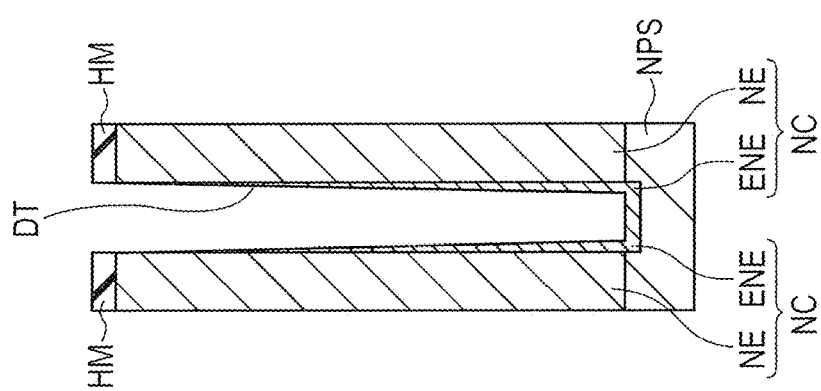
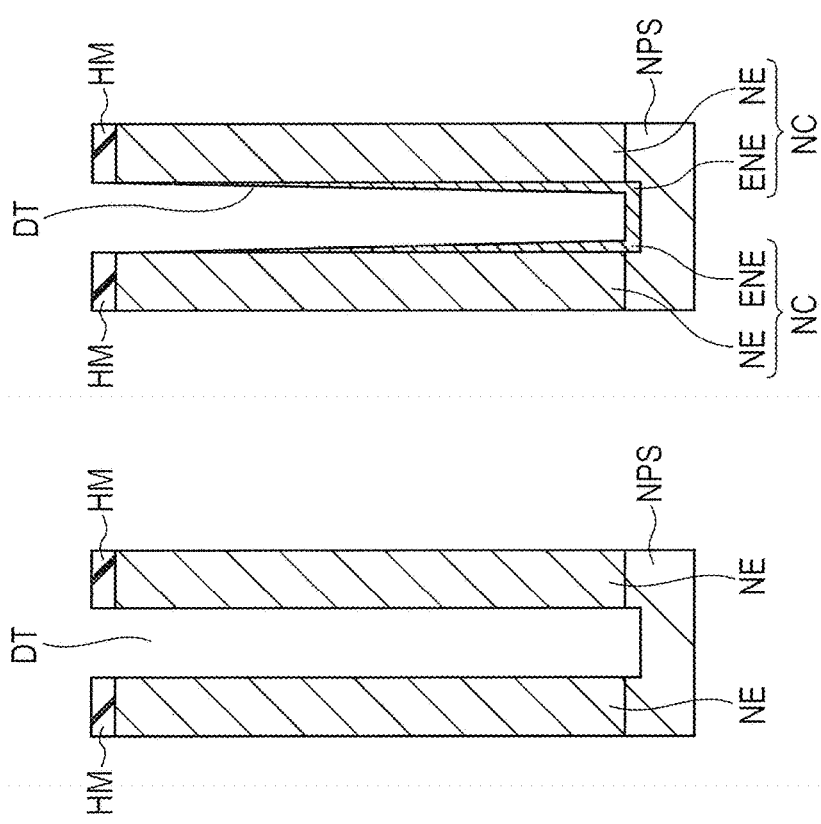

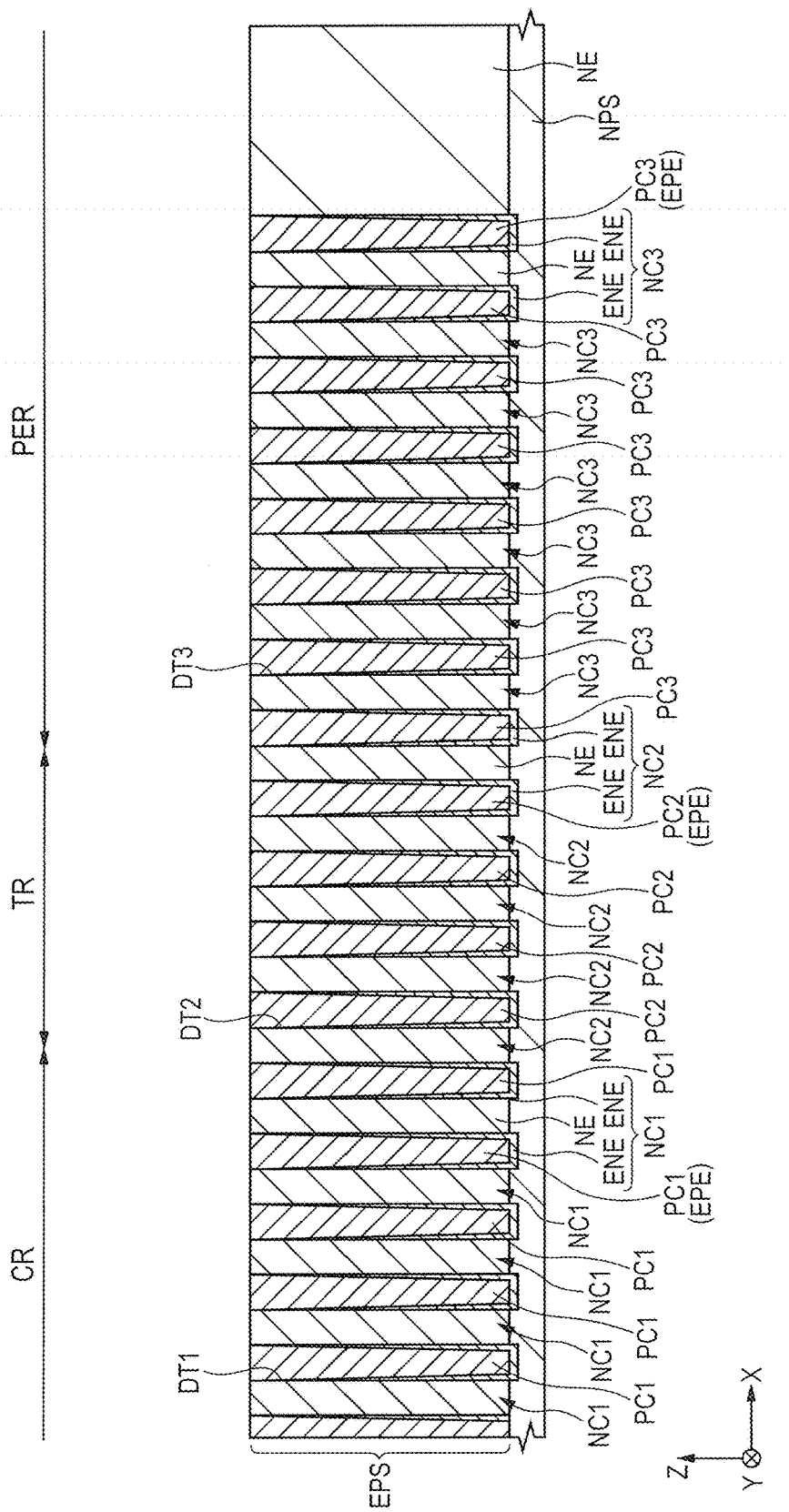

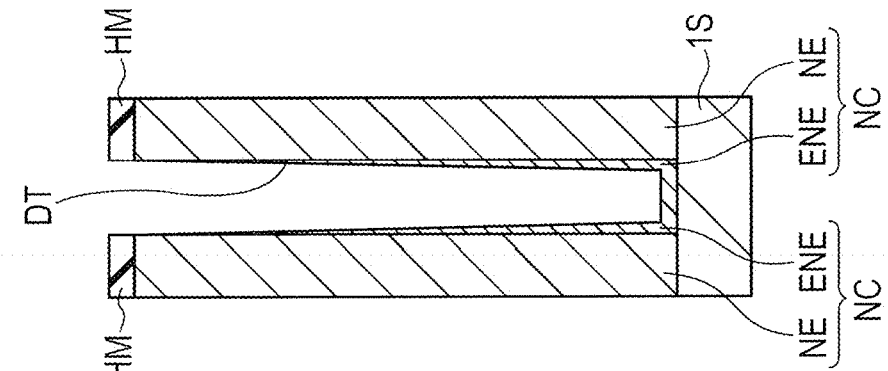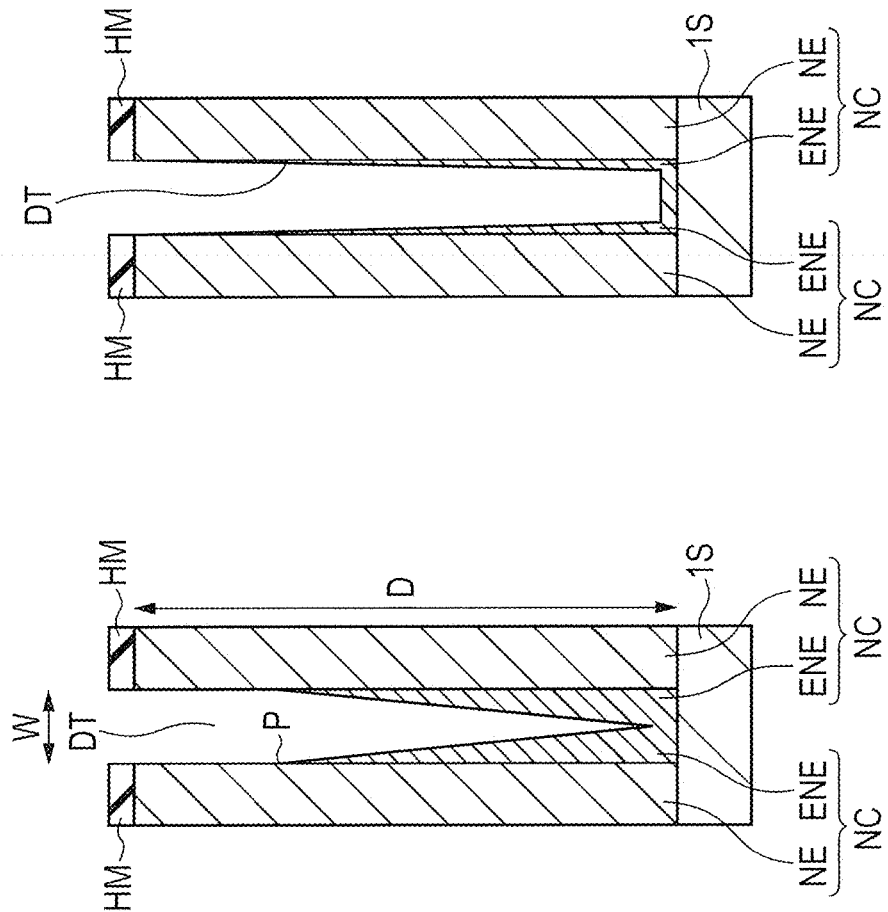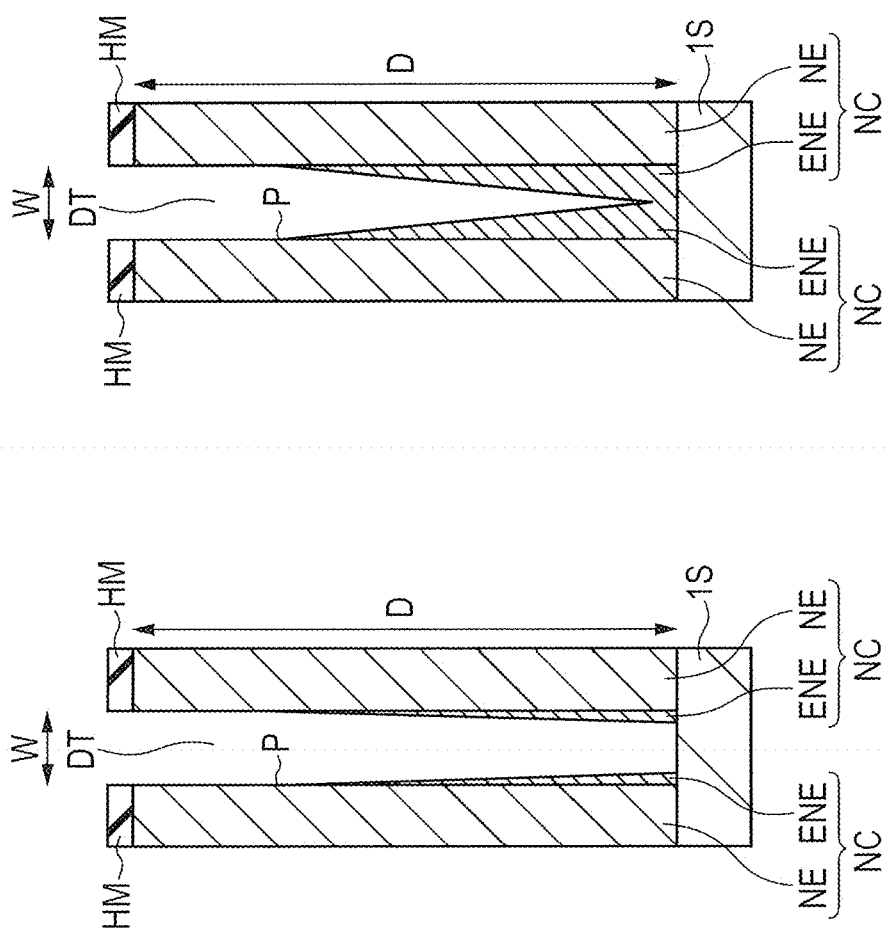

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2016-177033 filed on Sep. 9, 2016 including the specification, drawings and abstract is incorporated herein by reference in its entirety.

BACKGROUND

The present invention relates to a semiconductor device and a method of manufacturing the semiconductor device. For example, the invention relates to a semiconductor device having a superjunction structure and a method of manufacturing the semiconductor device.

For a vertical power MOSFET being a power semiconductor device, use of a superjunction structure is investigated to reduce on resistance while a withstand voltage is maintained.

For example, Japanese Unexamined Patent Application Publication No. 2008-305927 discloses a semiconductor device having a PN column layer in which n-conductivity-type columns and p-conductivity-type columns are alternately arranged while being in contact with each other. Japanese Unexamined Patent Application Publication No. 2008-305927 further discloses a technology, in which a trench is formed, the trench being narrow on a silicon substrate side (bottom face side) and wide on an upper opening side, and an embedded epitaxial layer made of silicon having the p conductivity type is formed in the trench such that impurity concentration is distributed to be high on the silicon substrate side (bottom face side) and low on the upper opening side.

SUMMARY

The inventors are engaged in research and development of a vertical power MOSFET including a superjunction structure, and have made earnest investigations on improving performance of the power MOSFET. Through the investigations, it has been found that there is room for further improvement in structure and manufacturing method of the vertical power MOSFET including the superjunction structure to improve performance of the vertical power MOSFET.

Other objects and novel features will be clarified from the description of this specification and the accompanying drawings.

Typical embodiments disclosed in this application are briefly summarized as follows.

In a semiconductor device of one embodiment disclosed in this application, a plurality of first pillars having a first conductivity type and a plurality of second pillars having a second conductivity type, which is a conductivity type opposite to the first conductivity type, are alternately arranged, and a plurality of first trenches are provided in a semiconductor layer. Each of the second pillars includes a first section including the semiconductor layer having the second conductivity type located between the first trenches provided in the semiconductor layer, and a second section including a tapered embedded semiconductor film having the second conductivity type disposed on a side face of each of the first trenches, and the first pillars each include an embedded semiconductor film having the first conductivity type disposed in the first trench.

A method of manufacturing a semiconductor device according to one embodiment disclosed in this application has the following steps, the semiconductor device including a plurality of first pillars having a first conductivity type formed in a semiconductor layer and a plurality of second pillars having a second conductivity type that is a conductivity type opposite to the first conductivity type. (a) A step of providing a semiconductor substrate having a main surface on which the semiconductor layer having the second conductivity type is provided. (b) A step of forming a plurality of first trenches and first sections located between the first trenches in the semiconductor layer, the first sections each including the semiconductor layer having the second conductivity type. (c) A step of forming second sections, each including a tapered embedded semiconductor film having the second conductivity type, on side faces of the first trenches, thereby forming the second pillars each including the first section and the second section. (d) After the step (c), a step of forming the first pillars by forming the embedded semiconductor film having the first conductivity type in the first trenches.

According to the semiconductor device of a typical embodiment as described below disclosed in this application, properties of the semiconductor device can be improved.

According to the method of manufacturing a semiconductor device of a typical embodiment as described below disclosed in this application, a semiconductor device having good properties can be manufactured.

BRIEF DESCRIPTION OF THE DRAWINGS

FIGS. 10A and 10B are SEM photographs of a trench having a high aspect ratio.

FIG. 12 is a sectional view illustrating a manufacturing process of the semiconductor device of the first embodiment.

FIGS. 27A to 27D are sectional views illustrating a formation process of a superjunction structure of the second embodiment.

FIGS. 31A to 31D are sectional views illustrating a formation process of a superjunction structure of the third embodiment.

FIG. 32 is a sectional view illustrating a superjunction structure of the third embodiment.

FIGS. 34A to 34C are sectional views illustrating another example of a configuration of the semiconductor device of the third embodiment.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the mentioned number. In other words, the number may be not less than or not more than the mentioned number.

Furthermore, in each of the following embodiments, a constitutional element (including an element step etc.) of the embodiment is not necessarily indispensable except for the particularly defined case and for the case where the constitutional element is considered to be indispensable in principle. Similarly, in each of the following embodiments, when a shape of a constitutional element, a positional relationship, and the like are described, any configuration substantially closely related to or similar to such a shape or the like should be included except for the particularly defined case and for the case where such a configuration is considered to be not included in principle. The same holds true in each of the number and the like (including the number, a numerical value, amount, and a range).

Hereinafter, some embodiments will be described in detail with reference to the accompanying drawings. In all drawings for explaining the embodiments, components having the same function are designated by the same or relevant numeral, and duplicated description is omitted. If a plurality of similar components (sites) exist, the numeral for a general term may be further marked with a sign to indicate an individual or a particular site. In the following embodiments, the same or similar portion is not repeatedly described in principle except for a particularly required case.

Furthermore, a sectional view for explaining each embodiment may not be hatched for better viewability. A plan view may be hatched for better viewability.

In the sectional views and the plan views, size of each site does not correspond to size of an actual device, and a particular site may be illustrated to be relatively large for better viewability. Even if a sectional view corresponds to a plan view, a particular site may be illustrated to be relatively large for better viewability.

First Embodiment
Description of Structure

Figure 1:
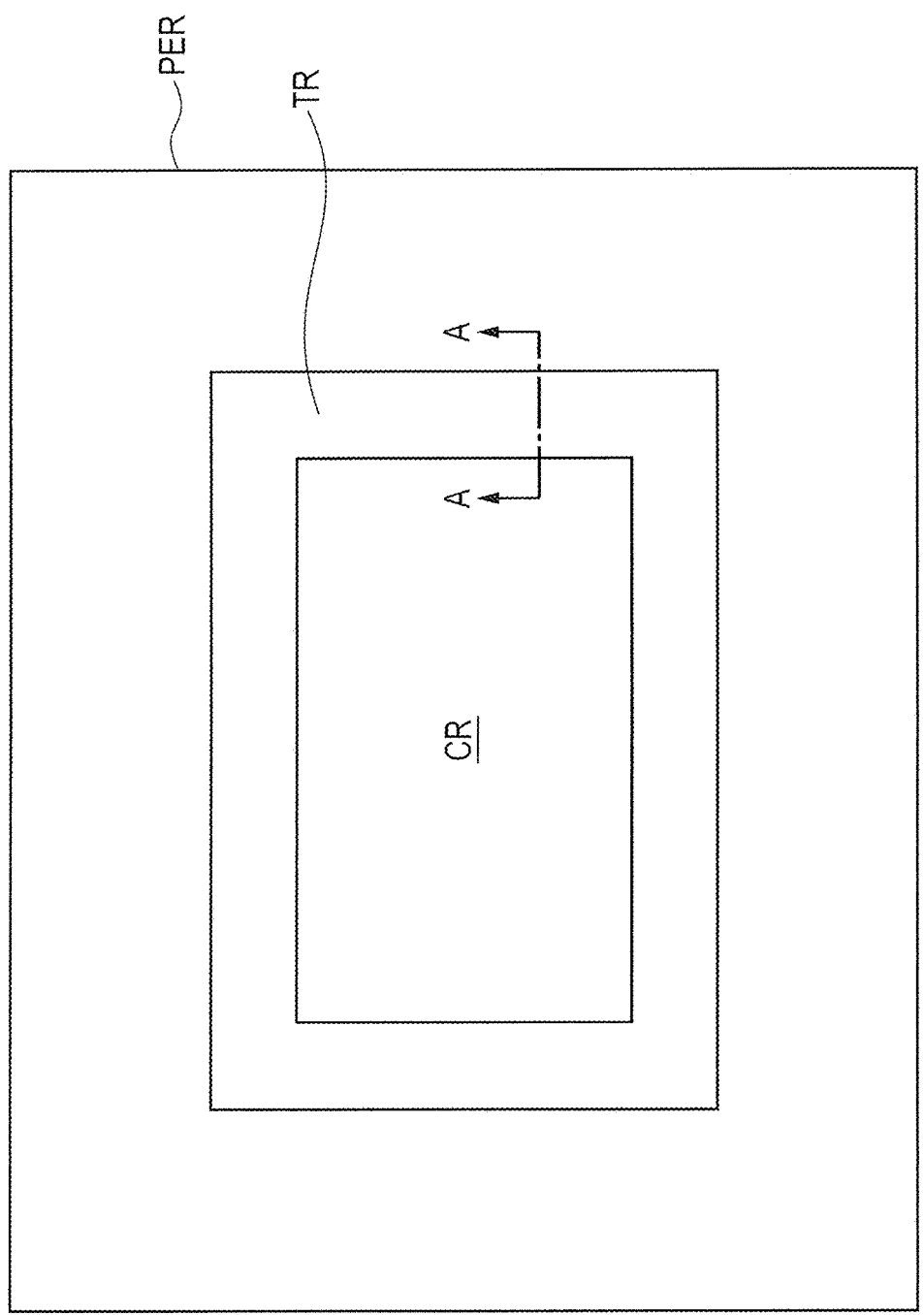
FIG. 1 is a plan view schematically illustrating a configuration of a semiconductor device of a first embodiment.
Figure 2:
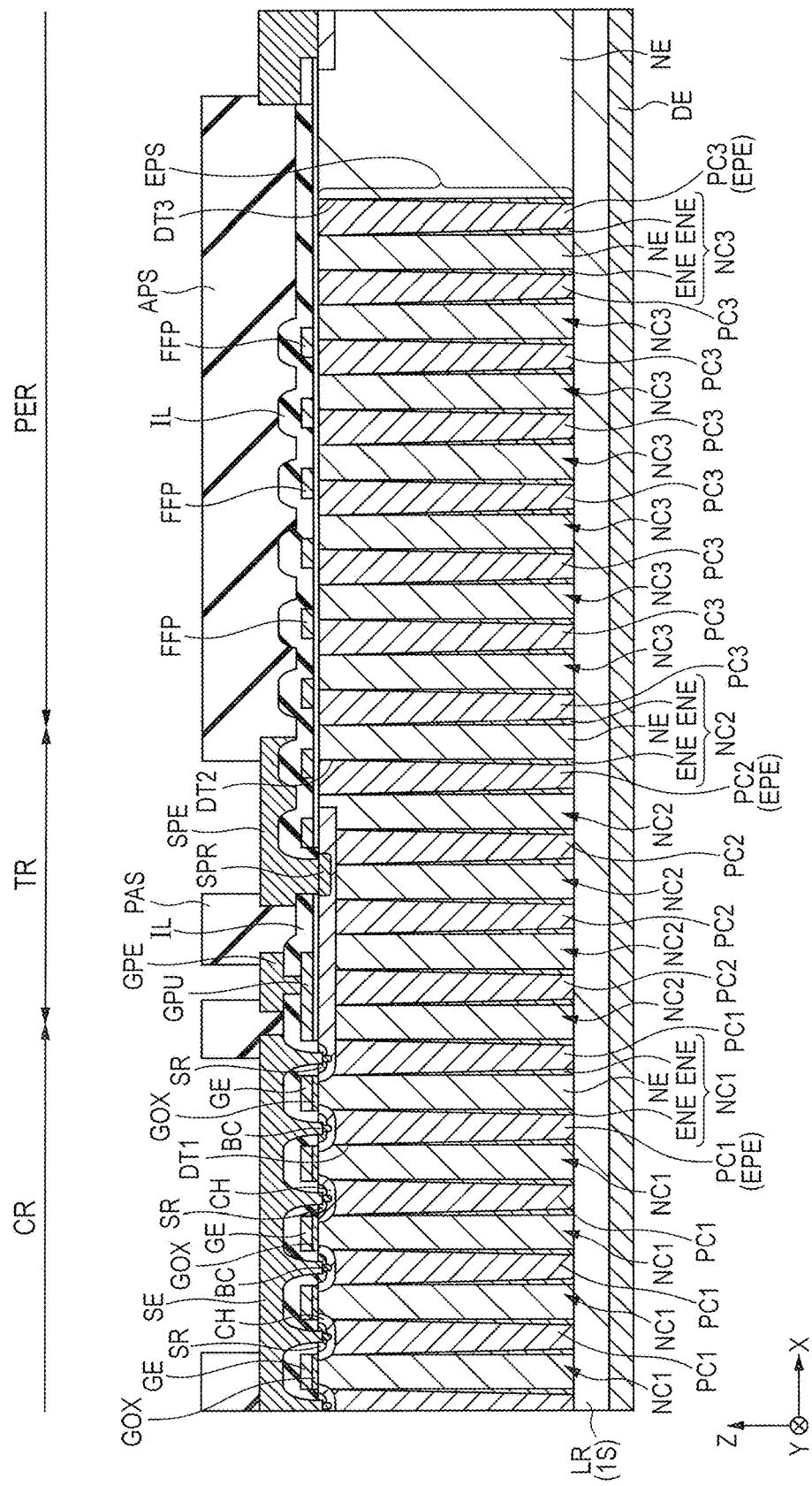
FIG. 2 is a sectional view illustrating the configuration of the semiconductor device of the first embodiment.
Figure 3:
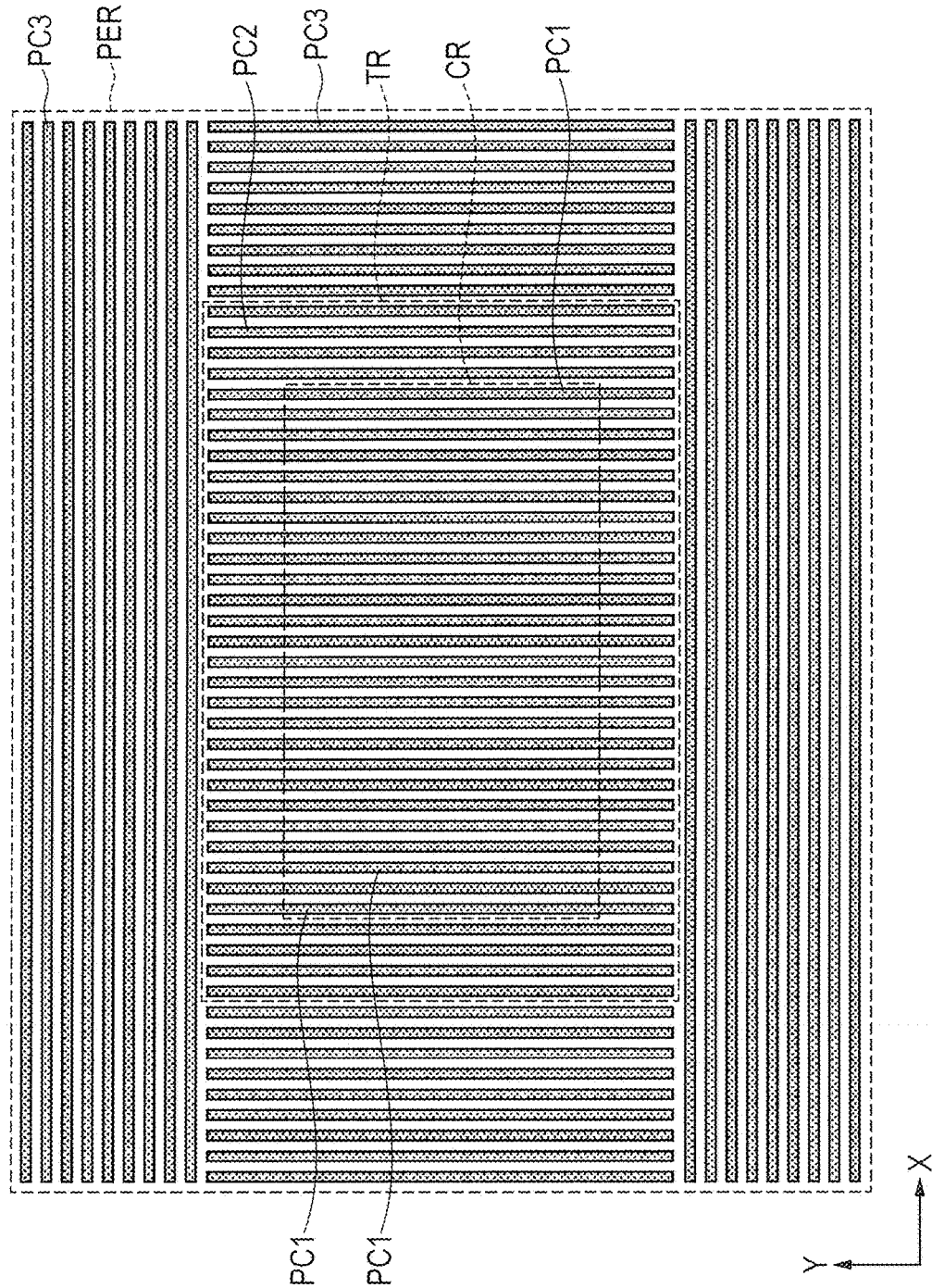
FIG. 3 is a plan view illustrating a configuration of a p-type column region of the semiconductor device of the first embodiment.

FIG. 1 is a plan view schematically illustrating a configuration of a semiconductor device of a first embodiment. FIG. 2 is a sectional view illustrating the configuration of the semiconductor device of the first embodiment. The cross section of FIG. 2 corresponds to a portion along A-A in FIG. 1, for example. The semiconductor device (semiconductor element) of the first embodiment is a vertical power metal oxide semiconductor field effect transistor (MOSFET). MOSFET may be referred to as MISFET (metal insulator semiconductor field effect transistor). FIG. 3 is a plan view illustrating a configuration of a p-type column region of the semiconductor device of the first embodiment.

As shown in FIG. 1, the semiconductor device (semiconductor chip) of the first embodiment has a rectangular shape in planar view from a top of the semiconductor device. The semiconductor device of the first embodiment has a cell region CR, an intermediate region (also referred to as termination section) TR, and a peripheral region PER. The cell region CR is disposed in the middle of the substantially rectangular semiconductor device, the intermediate region TR is disposed so as to surround the periphery of the cell region CR, and the peripheral region PER is disposed so as to surround the intermediate region TR.

Figure 4:
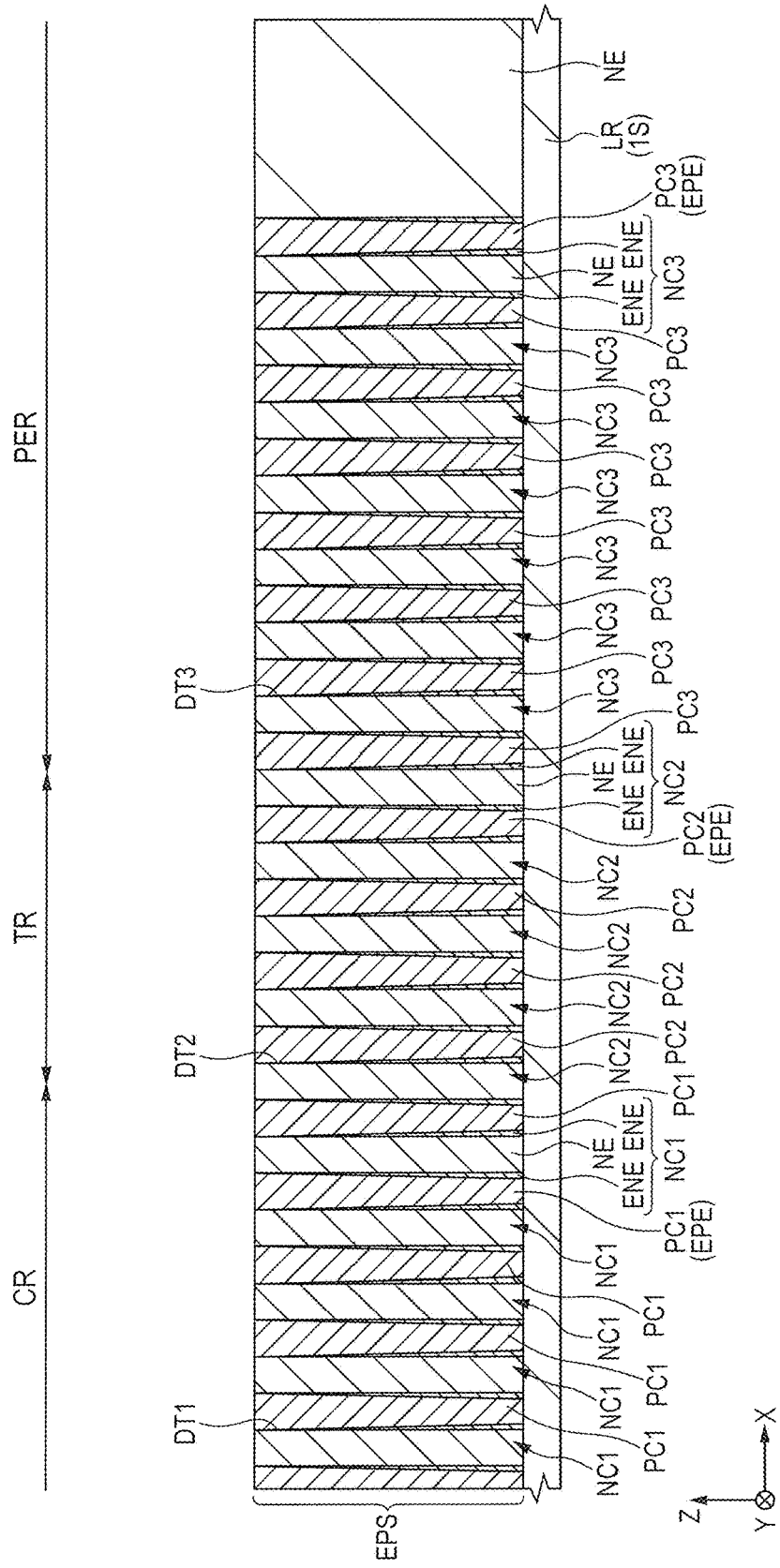
FIG. 4 is a sectional view illustrating a superjunction structure of the first embodiment.

As shown in FIGS. 2 and 3, a structure, in which linear p-type column regions (PC1 to PC3) and linear n-type column regions (NC1 to NC3) are alternately and periodically arranged, is provided in each of the cell region CR, the intermediate region TR, and the peripheral region PER. Such a structure is referred to as superjunction structure. FIG. 4 is a sectional view illustrating the superjunction structure of the first embodiment. As shown in FIG. 4, a power MOSFET is provided on the cell region CR having the structure, in which the p-type column regions PC1 and the n-type column regions NC1 are alternately and periodically arranged (see FIG. 2).

Such a super junction structure (see FIGS. 2 and 4) is used, thereby a depletion layer extends laterally from a boundary region between the p-type column region PC1 and the n-type column region NC1, i.e., from a vertically extending pn-junction; hence, a withstand voltage can be adequately provided. Specifically, when impurity concentration of the n-type column region NC1 serving as a current path is increased to reduce ON resistance of the power MOSFET, the withstand voltage tends to be reduced. However, when the super junction structure is used, the on resistance can be reduced while a high withstand voltage is provided.

The p-type column regions (PC2, PC3) and the n-type column regions (NC2, NC3) are periodically arranged not only in the cell region CR but also in each of the intermediate region TR and the peripheral region PER, thereby a depletion layer expands so as to surround the cell region CR; hence, the withstand voltage can be further increased.

In the first embodiment, as shown in FIGS. 2 and 4, the n-type column regions (NC1 to NC3) each have a trapezoidal shape in which an upper base is smaller than a lower base. The p-type column regions (PC1 to PC3) each have an inverted trapezoidal shape in which an upper base is larger than a lower base.

Figure 5:
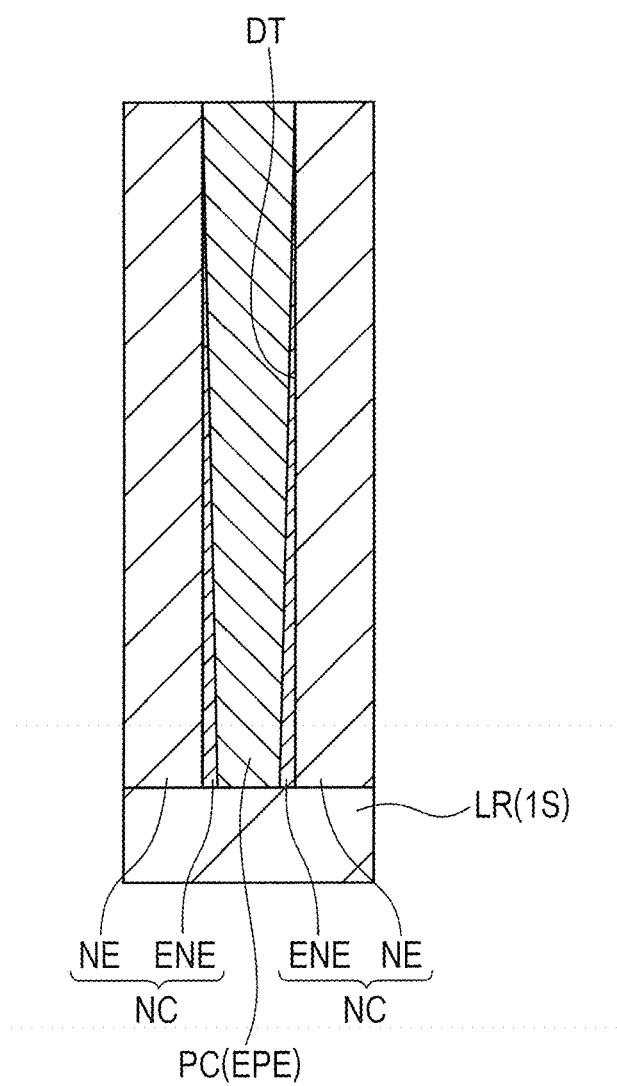
FIG. 5 is an enlarged view of the p-type column region with its vicinity of the first embodiment.

The superjunction structure is described in more detail with reference to FIG. 5 and FIGS. 6A to 6D. FIG. 5 is an enlarged view of the p-type column region with its vicinity of the first embodiment. FIGS. 6A to 6D are sectional views illustrating a formation process of the superjunction structure of the first embodiment.

As shown in FIG. 5, the n-type column regions (NC1 to NC3) each have a vertical section including an epitaxial layer NE and a tapered section including a tapered embedded n-type epitaxial film ENE disposed on a side face of the vertical section. Hence, as described above, the n-type column regions (NC1 to NC3) each have a regular trapezoidal shape in which an upper base is smaller than a lower base. The p-type column regions (PC1 to PC3) each have an inverted trapezoidal shape in which an upper base is larger than a lower base.

Figure 6A:
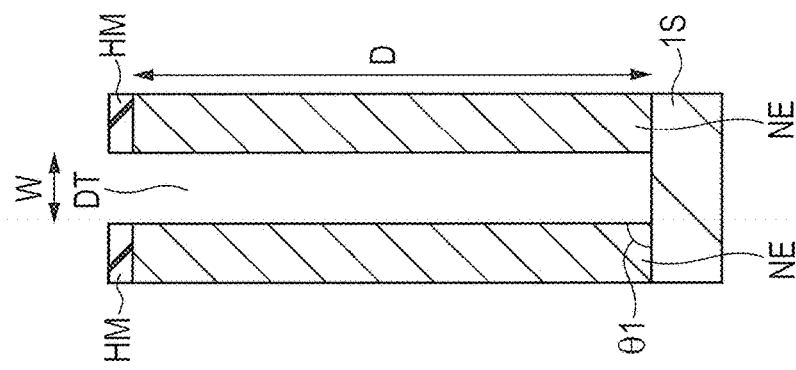
FIGS. 6A to 6D are sectional views illustrating a formation process of the superjunction structure of the first embodiment.

Such a superjunction structure can be formed as follows. For example, as shown in FIG. 6A, a semiconductor substrate 1S having a main surface (surface, top), on which an epitaxial layer NE including an n-type semiconductor layer is provided, is etched using a hard mask HM having a desired shape as a mask, thereby a trench DT is formed. For example, the trench DT has an opening width of about 4 µm and a depth D of about 50 µm. A distance between the trenches (DT1, DT2, or DT3) shown in FIG. 4 is about 4 µm. It is possible to adjust the opening width of each trench (DT1, DT2, or DT3) to 2 to 5 µm, and adjust the depth of the trench (DT1, DT2, or DT3) to be in a range from 40 to 60 µm. A lateral distance between the trenches (DT1, DT2, or DT3) can be adjusted within a range from 2 to 5 µm.

An angle $\theta1$ between the side face of the trench DT and the surface of the semiconductor substrate 1S is 89° to 90°. In other words, the angle $\theta1$ between the side face of the trench DT and a bottom face of the epitaxial layer NE is 89° to 90°. In this way, there is formed the trench DT that has a high aspect ratio (10 or more) and provides a substantially vertical angle $\theta1$ between the side face of the trench and the surface of the semiconductor substrate 1S. A Bosch process is preferably used as an etching process to form such a trench DT. In the Bosch process, etching (for example, etching with $SF_6$) and deposition of a protective film (for example, film formation with $C_4F_8$) are repeated. The aspect ratio is defined as a ratio of etching depth D to opening width W.

Figure 6B:
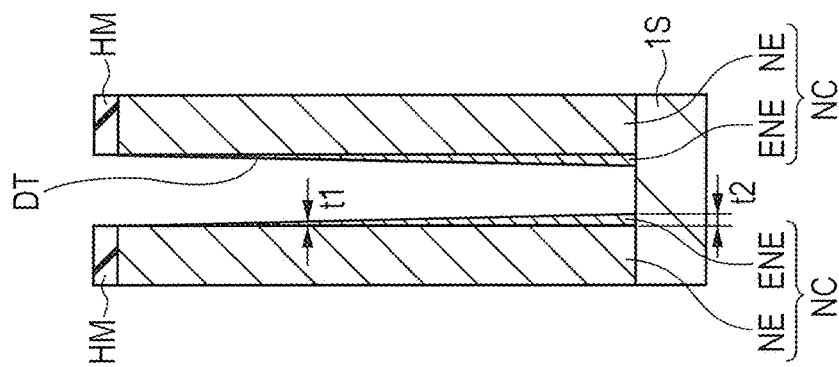

Subsequently, as illustrated in FIG. 6B, the tapered embedded n-type epitaxial film ENE is formed on the side face (sidewall) of the trench DT. For example, an epitaxial layer made of silicon is grown while an n-type impurity is introduced. At this time, the tapered embedded n-type epitaxial film ENE can be formed by introducing a silicon etching gas (for example, HCl) together with a silicon compound (for example, $SiH_4$) as a source gas. Specifically, the film is formed in an eaves shape at an upper part (shoulder) of the trench DT through introduction of only the source gas, which may cause clogging of the upper part of the trench. However, a film formation component in the upper part of the trench is etched through the additional introduction of the etching gas, so that the source gas enters into the bottom portion of the trench, and the film is also formed therein. In this way, the embedded n-type epitaxial film ENE has a small thickness (t1) on the upper side of the side face while having a large thickness on a lower side of the side face (t2>t1). The upper side of the side face refers to thickness of the embedded n-type epitaxial film ENE above at least half the depth D of the trench.

Figure 6C:
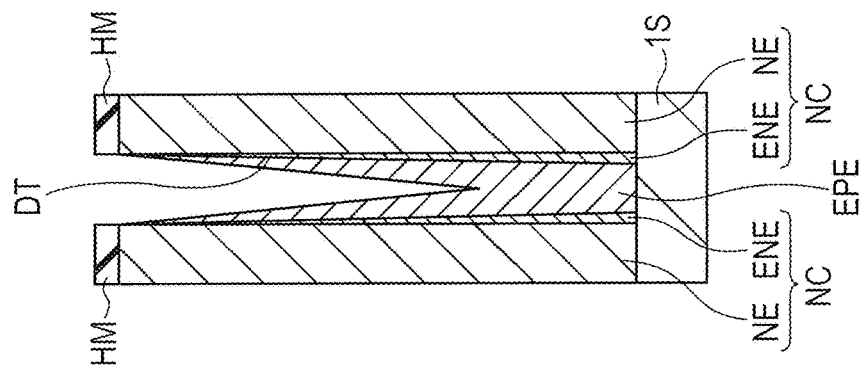
Figure 6D:
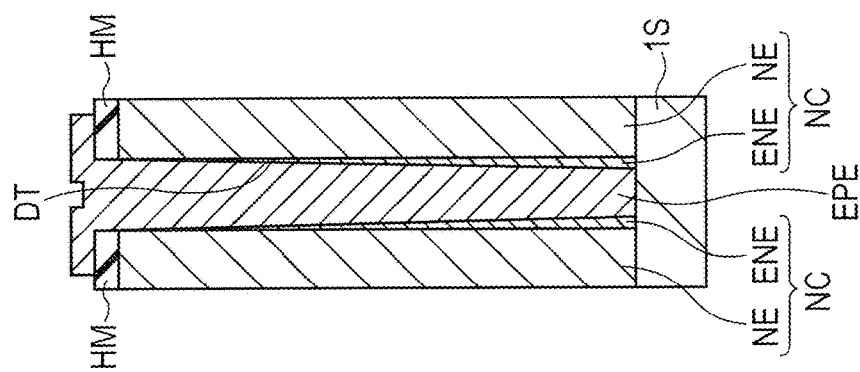

Subsequently, as illustrated in FIG. 6C, an embedded p-type epitaxial film EPE is formed within the trench DT by an epitaxial growth process. Specifically, the impurity to be introduced is switched from the n-type impurity to a p-type impurity, and an epitaxial layer is grown while the p-type impurity is introduced. At this time, the embedded p-type epitaxial film EPE is grown so as to cover the bottom face of the trench DT and the side face of the embedded n-type epitaxial film ENE. When the growth is further continued, as shown in FIG. 6D, the inside of the trench DT is filled with the embedded p-type epitaxial film EPE, and the embedded p-type epitaxial film EPE is grown into a thickness over a height of the hard mask HM located between the trenches DT.

Subsequently, the embedded p-type epitaxial film EPE over the trench DT and the hard mask HM are removed. For example, the embedded p-type epitaxial film EPE over the trench DT is removed by a chemical mechanical polishing (CMP) process with the hard mask HM as a stopper, and the remaining hard mask HM is further removed by etching. As a result, a superjunction structure including the p-type column regions PC and the n-type column regions NC is formed (see FIG. 4).

The n-type column regions (NC1 to NC3) of the first embodiment each include a semiconductor region (epitaxial layer) made of silicon or the like containing an n-type impurity such as phosphorus (P) or arsenic (As) introduced therein. The vertical section (epitaxial layer NE) configuring the n-type column regions (NC1 to NC3) has an n-type impurity concentration of, for example, $3.0 \times 10^{15}/cm^3$. The tapered section including the embedded n-type epitaxial film ENE configuring the n-type column regions (NC1 to NC3) has an n-type impurity concentration of, for example, $5.0 \times 10^{15}/cm^3$.

The p-type column regions (PC1 to PC3) of the first embodiment are each configured of a semiconductor region (embedded p-type epitaxial film EPE) made of silicon or the like containing a p-type impurity such as boron (B) introduced therein. The semiconductor region (embedded p-type epitaxial film EPE) configuring the p-type column regions (PC1 to PC3) has a p-type impurity concentration of, for example, $3.0 \times 10^{15}/cm^3$.

As described above, in the first embodiment, since the tapered section including the embedded n-type epitaxial film ENE for the n-type column regions NC1 to NC3 is provided on the sidewalls of the respective trenches DT1 to DT3, in which the p-type column regions PC1 to PC3 are to be disposed, the p-type column regions PC1 to PC3 are each allowed to have an inverted trapezoidal shape, leading to an increase in margin for a variation in p-type impurity concentration of each of the p-type column regions PC1 to PC3. In addition, on resistance can be reduced by lateral diffusion of the n-type impurity (for example, As).

Figure 7:
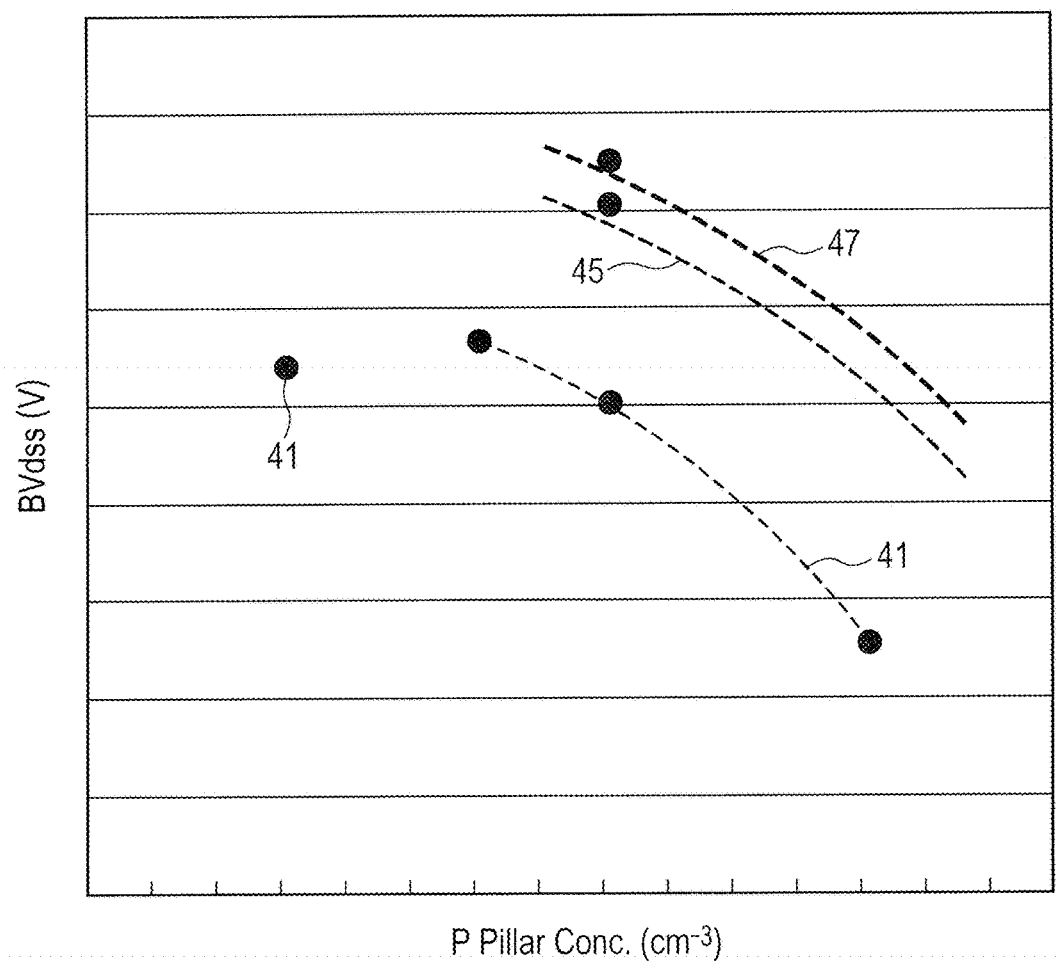
FIG. 7 is a graph illustrating a relationship between a trench depth and a withstand voltage.

FIG. 7 is a graph illustrating a relationship between a trench depth and a withstand voltage. The horizontal axis shows a concentration (P Pillar Conc. $[Cm^{-3}]$) of the p-type column region, and the vertical axis shows the withstand voltage (BVdss [V]). The numerical values in the graph each indicate the trench depth [μm]. As shown in FIG. 7, when the p-type column regions have a similar concentration, the withstand voltage increases with an increase in trench depth.

Figure 8A:
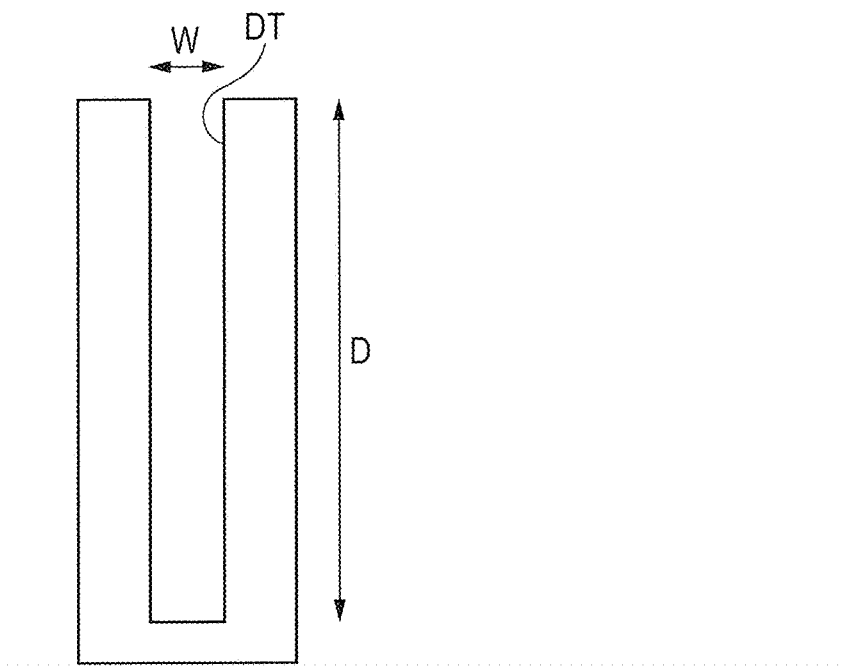
FIGS. 8A and 8B are sectional views illustrating a Bosch process.
Figure 8B:
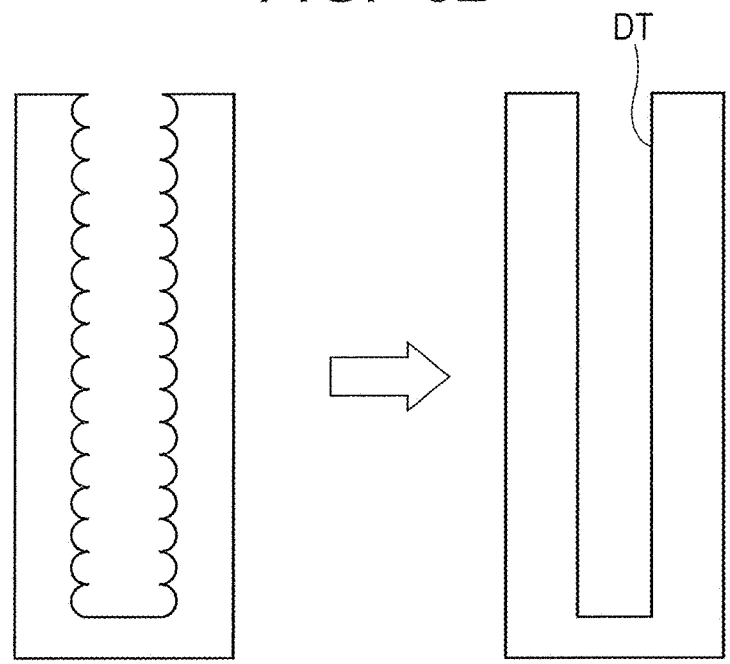

FIGS. 8A and 8B are sectional views illustrating a Bosch process. The Bosch process can be used as a method of forming the trench DT having an opening width (upper opening width) W and an etching depth D as shown in FIG. 8A. In the Bosch process, etching (for example, etching with $SF_6$) and deposition of a protective film (film formation with $C_4F_8$, for example) are repeated. Such a Bosch process makes it possible to form a trench DT having a large aspect ratio as shown in FIG. 8B. However, as shown in the left diagram of FIG. 8B, small irregularities are formed on the side face of the trench DT. Such small irregularities on the side face of the trench can be smoothed through hydrogen annealing treatment (heat treatment under a hydrogen atmosphere). Such a Bosch process and hydrogen annealing treatment can provide the angle θ1 of 89° to 90° between the side face and the surface of the semiconductor substrate 1S even for a trench having an aspect ratio of 10 or more.

Figure 9A:
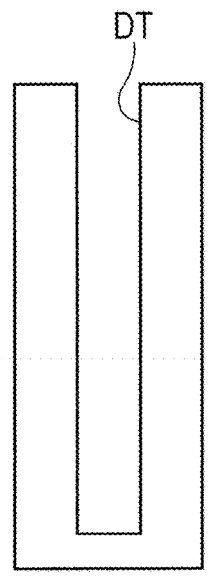
FIGS. 9A to 9C show trench shapes and a margin for a variation in p-type impurity concentration of the p-type column region.
Figure 9B:
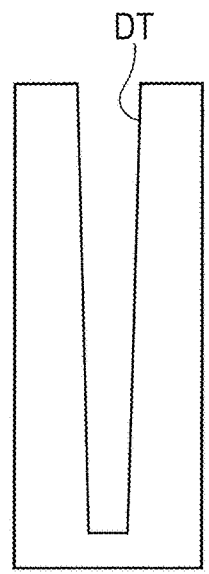
Figure 9C:
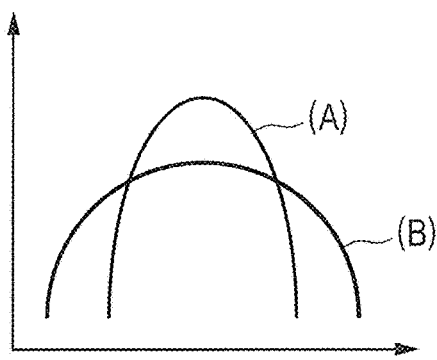

However, the side face of the trench DT, i.e., the side face of the p-type column region preferably has a tapered shape. FIGS. 9A to 9C show trench shapes and a margin for a variation in p-type impurity concentration of the p-type column region. The margin is examined for a trench having a side face that is substantially vertical (a trench providing an angle θ1 of 89° to 90° between the side face and the surface of the semiconductor substrate 1S) as shown in FIG. 9A, and for a trench having a tapered side face (a trench providing an angle θ1 of about 88.5° between the side face and the surface of the semiconductor substrate 1S) as shown in FIG. 9B. Results are shown in FIG. 9C. In the graph of FIG. 9C, the horizontal axis shows the p-type impurity concentration of the p-type column region, and the vertical axis shows the withstand voltage. The graph (A), which represents the data of the trench having the substantially vertical side face, shows a large maximum value of the withstand voltage, but shows that even a small shift in p-type impurity concentration leads to an abrupt reduction in withstand voltage. This means a small margin for a variation in p-type impurity concentration. On the other hand, the graph (B), which represents the data of the trench DT having the tapered side face, shows that even if the p-type impurity concentration slightly varies, the withstand voltage is reduced gently. In this way, the side face of the trench DT, i.e., the side face of the p-type column region is formed into a tapered shape, which makes it possible to increase the margin for a variation in the p-type impurity concentration of the p-type column region PC1. The withstand voltage can be increased by increasing the trench depth by using the Bosch process.

FIGS. 10A and 10B are SEM photographs of a trench having a high aspect ratio investigated by the inventors. FIG. 10B is a partial enlarged view of FIG. 10A. As shown in FIGS. 10A and 10B, the trench having an aspect ratio of 10 or more is also allowed to provide an angle θ1 of 89° to 90° between the side face of the trench and the surface of the semiconductor substrate 1S by the Bosch process and the hydrogen annealing treatment.

Figure 11A:
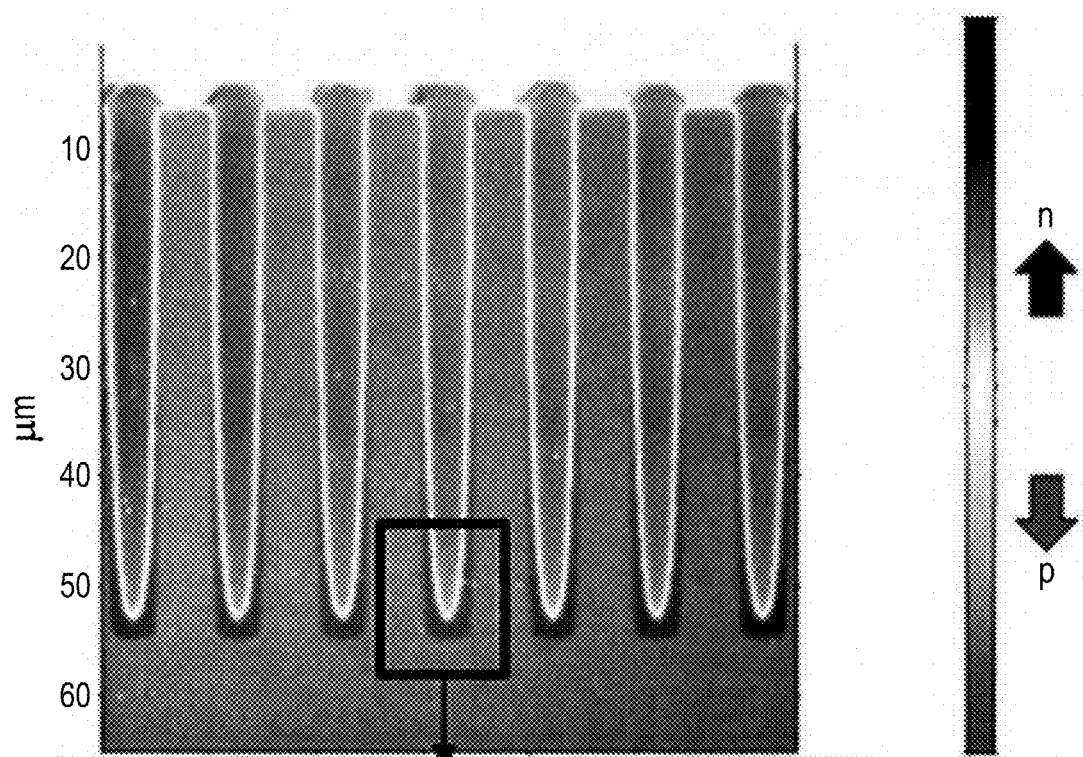
FIGS. 11A and 11B are SEM photographs of the p-type column region with its vicinity.
Figure 11B:
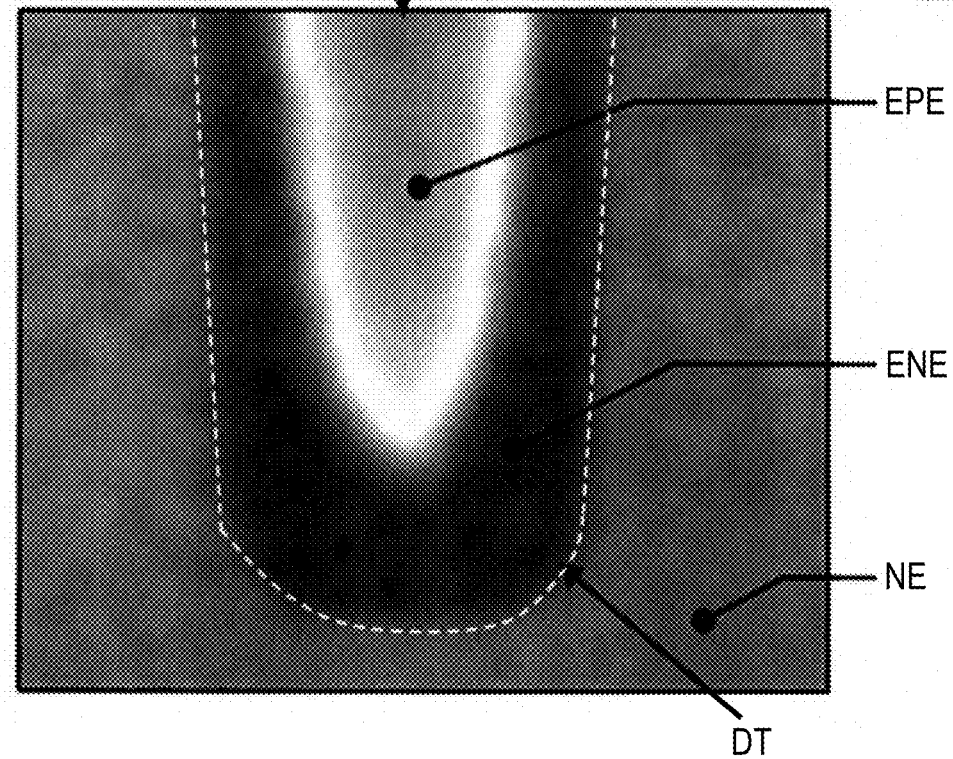

FIGS. 11A and 11B are SEM photographs of the p-type column region with its vicinity investigated by the inventors. As seen in FIGS. 11A and 11B, when the embedded n-type epitaxial film ENE and the embedded p-type epitaxial film EPE are sequentially grown within the trench DT, the side face of the p-type column region has a tapered shape.

As described above, in the first embodiment, since the tapered section including the embedded n-type epitaxial film ENE is provided on the sidewall of the trench DT in which the p-type column region PC is to be disposed, the p-type column region PC is allowed to have the inverted trapezoidal shape, leading to an increase in the margin for the variation in the p-type impurity concentration of the p-type column region PC.

Consequently, as described above, the margin for the variation in the p-type impurity concentration of each of the p-type column regions PC1 to PC3 can be increased. For example, when an epitaxial layer made of silicon is grown while an impurity is introduced, the impurity concentration is not necessary to be controlled accurately, leading to better controllability. In addition, it is possible to reduce a possibility of defects caused by a withstand voltage that does not meet a desired standard due to the variation in the impurity concentration. Furthermore, when the epitaxial layer is grown by a batch method, a processed lot as a whole may become defective. However, it is possible to improve the product yield by increasing the margin for the variation in the impurity concentration.

A configuration of each region of the semiconductor device is now described in detail with reference to FIG. 2.

(1) Structure of Cell Region CR

As shown in FIG. 2, a power MOSFET is provided in the cell region CR. The power MOSFET is provided over a main surface of an epitaxial layer EPS on the semiconductor substrate 1S. The epitaxial layer EPS includes a plurality of p-type column regions (p-type pillars, pillars) PC1 and a plurality of n-type column regions (n-type pillars, pillars) NC1. The p-type column regions PC1 and the n-type column regions NC1 are alternately arranged in an X direction. As shown in FIG. 3, the p-type column region PC1 has a linear shape (a rectangular shape having long sides in a Y direction) in planar view from its top.

For example, it is designed that the p-type column region PC1 has an upper part width (dimension in the X direction) and a depth (dimension in the Y direction) that are the same as those of the n-type column region NC1.

As described above, the n-type column region NC1 has a substantially columnar shape that includes the vertical section including the epitaxial layer NE and the tapered section including the tapered embedded n-type epitaxial film ENE disposed on the side face of the vertical section, and is configured of the semiconductor region (epitaxial layer) containing the n-type impurity such as phosphorus (P) or arsenic (As) introduced therein. The n-type column regions NC1 and the semiconductor substrate 1S configure a drain region of the power MOSFET. The n-type column region NC1 is sandwiched between the two p-type column regions PC1. The n-type column regions NC1 are disposed apart from each other by the upper part width (dimension in the X direction) of the p-type column region PC1.

The p-type column region PC1 has, for example, a substantially columnar shape, and is configured of a semiconductor region containing the p-type impurity such as boron (B) introduced therein. The p-type column region PC1 is sandwiched between the two n-type column regions NC1. The p-type column regions PC1 are disposed apart from each other by the upper part width (the dimension in the X direction) of the n-type column region NC1.

The power MOSFET is provided on a main surface of a structure (epitaxial layer EPS), in which such p-type column regions PC1 and n-type column regions NC1 are periodically arranged.

The power MOSFET has gate electrodes GE that are each disposed on the n-type column region NC1 with a gate insulating film GOX in between. For example, a silicon oxide film can be used as the gate insulating film GOX. Not only the silicon oxide film but also, for example, a high-dielectric-constant film having a dielectric constant higher than the silicon oxide film may be used as the gate insulating film GOX. For example, a polycrystalline silicon film can be used as the gate electrode GE.

A channel region CH is disposed in an upper part the p-type column region PC1 on both sides of the gate electrode GE. A source region SR is disposed so as to be enveloped by the channel region CH. The channel region CH is configured of a semiconductor region containing the p-type impurity such as boron (B) introduced therein. The source region SR is configured of a semiconductor region containing the n-type impurity such as phosphorus (P) or arsenic (As) introduced therein. As described above, the n-type column regions NC1 and the semiconductor substrate 1S configure the drain region of the power MOSFET.

When a potential is applied to the gate electrode GE of the power MOSFET, carrier (electron) flows from the source region SR to the drain region (n-type column region NC1, semiconductor substrate 1S (LR)) via the inversion layer formed in the channel region CH. In other words, a current flows from the drain region (n-type column region NC1, semiconductor substrate 1S (LR)) to the source region SR via the inversion layer formed in the channel region CH.

The gate electrode GE extending in the Y direction, the n-type column region NC1 below the gate electrode GE, and the source regions SR on both sides of the gate electrode GE are repeatedly arranged while forming a unit cell. A plurality of such unit cells are coupled in parallel and form one power MOSFET.

A body contact region BC, which reaches the channel region CH from the top of the epitaxial layer EPS, is provided in the middle of the source region SR. The body contact region BC is configured of a semiconductor region containing the p-type impurity such as boron (B) introduced therein. The body contact region BC has an impurity concentration higher than the channel region CH.

The top and the side faces on both sides of the gate electrode GE are covered with an interlayer insulating film IL. For example, a silicon oxide film can be used as the interlayer insulating film IL. The interlayer insulating film IL on the body contact region BC and on the source region SR on both sides of the body contact region BC is removed, and thus a contact hole is formed. The source electrode SE is disposed on the contact hole and the interlayer insulating film IL. For example, a stacked film of a barrier conductor film including a titanium tungsten film and a main conductor film including an aluminum film on the barrier conductor film can be used as the source electrode SE.

Consequently, the source electrode SE is electrically coupled to the source region SR, and electrically coupled to the channel region CH via the body contact region BC. The body contact region BC provides ohmic contact with the source electrode SE, and allows the source region SR to be electrically coupled to the channel region CH with the same potential.

It is therefore possible to suppress on operation of a parasitic npn bipolar transistor having the source region SR as an emitter region, the channel region CH as a base region, and the n-type column region NC1 as a collector region. Specifically, the source region SR is electrically coupled to the channel region CH with the same potential, which means that no potential difference exists between the emitter region and the base region of the parasitic npn bipolar transistor. Consequently, on operation of the parasitic npn bipolar transistor can be suppressed.

A surface protective film PAS is disposed on the source electrode SE so as to partially cover the source electrode SE. For example, a silicon oxide film can be used as the surface protective film PAS. A partial region of the source electrode SE is exposed from the surface protective film PAS. Drain electrodes DE each including a metal film are disposed on the back (surface opposite to the main surface having the epitaxial layer EPS) of the semiconductor substrate 1S.

(2) Structure of Intermediate Region TR

As shown in FIG. 2, the intermediate region TR has a gate lead section GPU, a gate lead electrode GPE, a source lead region SPR, and a source lead electrode SPE.

The gate lead section GPU and the gate lead electrode GPE are disposed on the epitaxial layer EPS over the semiconductor substrate 1S. The source lead region SPR is disposed in an upper part of the epitaxial layer EPS.

The p-type column regions PC2 and the n-type column regions NC2 are also periodically arranged in the intermediate region TR. In other words, as shown in FIG. 3, the linear p-type column regions PC1 and PC2 and the linear n-type column regions NC1 and NC2 are alternately arranged in a rectangular region. The cell region CR is located in the middle of the rectangular region, and the intermediate region TR corresponds to the outer peripheral region of the cell region CR. Hence, the linear p-type column regions PC2 and the linear n-type column regions NC2 are alternately arranged along sides extending in the Y direction of the intermediate region TR (right and left sides of the intermediate region TR in FIG. 3). In addition, ends of the linear p-type column regions PC1 and ends of the linear n-type column regions NC1 extending from the cell region CR are alternately arranged along sides (upper and lower sides in FIG. 3) extending in the X direction of the intermediate region TR.

In this way, the structure (epitaxial layer EPS), in which the p-type column regions PC2 and the n-type column regions NC2 are periodically arranged, of the intermediate region TR has a configuration similar to that of the structure (epitaxial layer EPS), in which the p-type column regions PC1 and the n-type column regions NC1 are periodically arranged, of the cell region CR.

The gate lead section GPU is disposed on the epitaxial layer EPS with the gate insulating film GOX in between. The channel region CH is also disposed below the gate lead section GPU. The interlayer insulating film IL is disposed so as to cover a top and side faces on both sides of the gate lead section GPU, and partially has an opening that exposes part of the top of the gate lead section GPU. For example, a polycrystalline silicon film can be used as the gate lead portion GPU as with the gate electrode GE.

The gate lead electrode GPE is disposed on the interlayer insulating film IL including within the opening. As with the source electrode SE, for example, a stacked film of a barrier conductor film including a titanium tungsten film and a main conductor film including an aluminum film on the barrier conductor film can be used as the gate lead electrode GPE.

The gate lead section GPU is electrically coupled to a plurality of gate electrodes GE, and a gate voltage applied to the gate lead electrode GPE is applied to each of the gate electrodes GE via the gate lead section GPU.

The channel region CH extending from the cell region CR is provided in the upper part of the epitaxial layer EPS. The source lead region SPR is disposed so as to be enveloped by the channel region CH. As with the source region SR, the source lead region SPR is configured of a semiconductor region containing the n-type impurity such as phosphorus (P) or arsenic (As) introduced therein.

The interlayer insulating film IL is disposed over the top of the epitaxial layer EPS so as to cover on the channel region CH, and the interlayer insulating film IL has an opening so as to expose the source lead region SPR.

The source lead electrode SPE is disposed on the interlayer insulating film IL including within the opening portion. As with the source electrode SE, for example, a stacked film of a barrier conductor film including a titanium tungsten film and a main conductor film including an aluminum film on the barrier conductor film can be used as the source lead electrode SPE.

In the intermediate region TR, the surface protective film PAS including a silicon oxide film is also disposed so as to partially cover the gate lead electrode GPE and the source lead electrode SPE, and a partial region of the gate lead electrode GPE and a partial region of the source lead electrode SPE are exposed from the surface protective film PAS.

(3) Structure of Peripheral Region PER

As shown in FIG. 2, field plate electrodes (electrodes, dummy electrodes) FFP are provided in the peripheral region PER.

The field plate electrodes FFP are each disposed over the epitaxial layer EPS on the semiconductor substrate 1S.

The p-type column regions PC3 and the n-type column regions NC3 are also periodically arranged in the peripheral region PER. As shown in FIG. 3, a peripheral region of a rectangular region (the cell region CR and the intermediate region TR), in which the linear p-type column regions PC1 and PC2 and the linear n-type column regions NC1 and NC2 are alternately arranged, corresponds to the peripheral region PER. The linear p-type column regions PC3 and the linear n-type column regions NC3 extending in the Y direction are alternately arranged along sides (right and left sides in FIG. 3) extending in the Y direction of the peripheral region PER. The linear p-type column regions PC3 and the linear n-type column regions NC3 extending in the X direction are alternately arranged along sides (upper and lower sides in FIG. 3) extending in the X direction of the intermediate region TR.

It is designed that the respective p-type column region PC3 and n-type column region NC3 in the peripheral region PER have the same widths as those of the p-type column region PC1 or PC2 and the n-type column region NC1 or NC2 in the cell region CR or the intermediate region TR.

The field plate electrodes FFP are provided over the layer (epitaxial layer EPS) including the p-type column regions PC3 and the n-type column regions NC3 in the peripheral region PER (FIG. 2). As with the gate electrode GE, for example, a polycrystalline silicon film can be used as each field plate electrode FFP. The field plate electrode FFP is covered with the interlayer insulating film IL provided thereon. The surface protective film PAS including a silicon oxide film is disposed on the interlayer insulating film IL. The field plate electrodes FFP are thus provided, thereby electric field concentration can be relieved, leading to an increase in withstand voltage.

For example, the field plate electrodes FFP are disposed over respective boundaries between the p-type column regions PC3 and the n-type column regions NC3, and are arranged in a line as with the p-type column regions PC3 and the n-type column regions NC3.

Another component may be disposed in each of the cell region CR, the intermediate region TR, and the peripheral region PER without limitation. For example, a guard ring may be provided in the peripheral region PER.

Description of Manufacturing Method

A method of manufacturing the semiconductor device of the first embodiment is now described with reference to FIGS. 12 to 25 while the configuration of the semiconductor device is further clarified. FIGS. 12 to 25 include sectional views and plan views illustrating a manufacturing process of the semiconductor device of the first embodiment. The semiconductor device of the first embodiment is manufactured using a method of so-called "trench fill process".

First, as shown in FIG. 12, there is provided the semiconductor substrate 1S having the main surface (surface, top) on which the epitaxial layer NE including an n-type semiconductor layer is provided. For example, the semiconductor substrate 1S is formed by introducing the n-type impurity such as phosphorus (P) or arsenic (As) into single crystal silicon. The epitaxial layer NE has an n-type impurity concentration of, for example, about $3.3 \times 10^{15}/cm^3$ and a thickness of, for example, about 40 to 60 μm.

Figure 13:
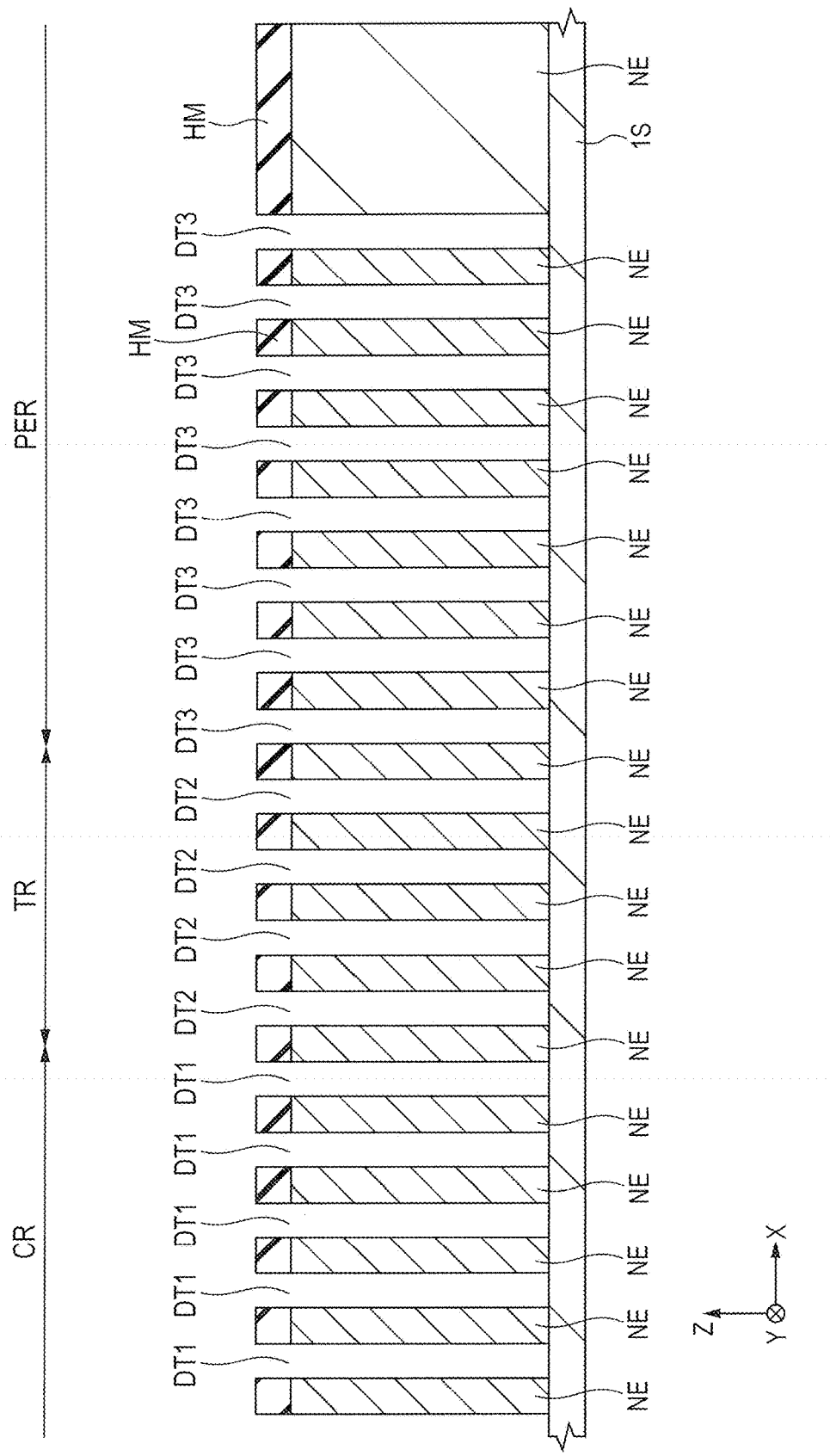
FIG. 13 is a sectional view illustrating the manufacturing process of the semiconductor device of the first embodiment, showing a step following FIG. 12.
Figure 14:
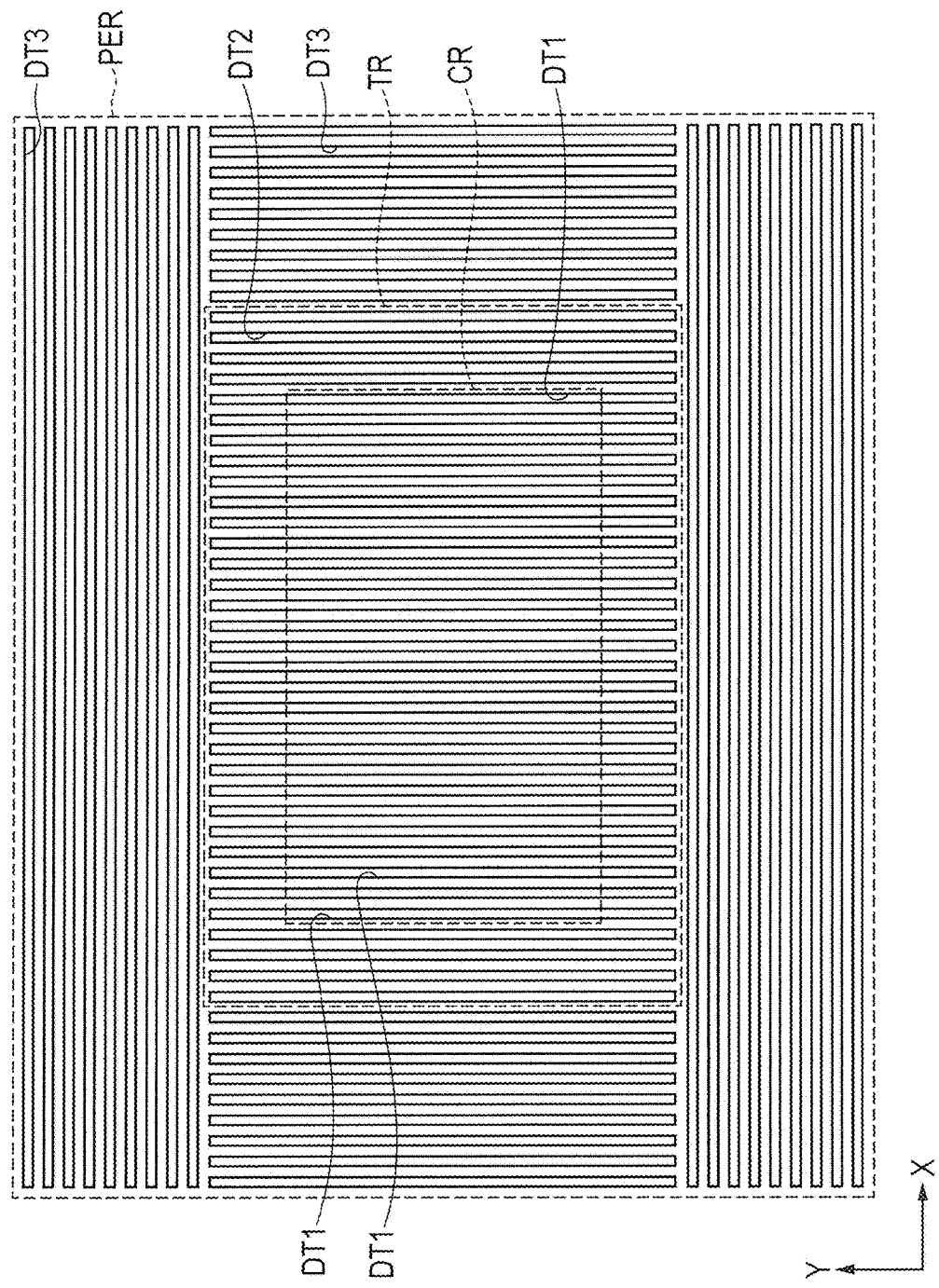
FIG. 14 is a plan view illustrating the manufacturing process of the semiconductor device of the first embodiment.

Subsequently, as shown in FIGS. 13 and 14, the hard mask HM is formed on the epitaxial layer NE. For example, a silicon oxide film is formed as the hard mask HM on the epitaxial layer NE, and an undepicted photoresist film is formed on the silicon oxide film and subjected to exposure and development. As a result, the photoresist film remains in the respective forming regions of the n-type column regions (NC1 to NC3) on the epitaxial layer NE. Subsequently, the hard mask (silicon oxide film) HM is etched using the photoresist film as a mask, and the photoresist film is then removed by asking or the like. In this way, a lower-layer film is processed into a desired shape through etching using a photoresist film, which is processed into a desired shape by exposure and development, as a mask. This operation is called patterning.

Subsequently, the epitaxial layer NE is etched using the hard mask (silicon oxide film) HM as a mask. As a result, the epitaxial layer NE is removed from the respective forming regions of the p-type column regions (PC1 to PC3), and thus the trenches (DT1 to DT3) are formed. The above-described Bosch process can be used as the etching process. In the Bosch process, etching (for example, etching with $SF_6$) and deposition of a protective film (for example, film formation with $C_4F_8$) are repeated. The Bosch process makes it possible to form a trench having a high aspect ratio. Subsequently, annealing treatment (hydrogen annealing) is performed for, for example, about 30 to 200 sec under a pressure of, for example, about 10 to 760 Torr in a hydrogen atmosphere (reducing atmosphere) at a temperature of, for example, about 950° to 1100° C. As a result, irregularities on the side faces of the trench are smoothed. Consequently, it is possible to form the trenches (DT1 to DT3) that each have an aspect ratio of 10 or more and provide the angle θ1 of 89° to 90° between the side face of the trench and the surface of the semiconductor substrate 1S.

The trench formed in the epitaxial layer NE in the cell region CR is denoted as DT1, the trench formed in the epitaxial layer NE in the intermediate region TR is denoted as DT2, and the trench formed in the epitaxial layer NE in the peripheral region PER is denoted as DT3. The trenches DT1 and DT2 each have a linear shape extending in the Y direction, and the trench DT3 has a linear shape extending in the Y or X direction (FIG. 14).

For example, each of the trenches DT1, DT2, and DT3 has a width (dimension in the X or Y direction) and a depth (dimension in the Z direction) of about 2 to 5 µm and about 40 to 60 µm, respectively. The epitaxial layer NE remaining between the trenches DT1, DT2 or DT3 becomes part of the linear n-type column region NC1, NC2, or NC3. For example, upper part width (dimension in the X direction) of the n-type column region (NC1, NC2, or NC3) is about 2 to 5 µm. Depth (dimension in the Z direction) of the n-type column region (NC1, NC2, or NC3) is about 40 to 60 µm.

Figure 15:
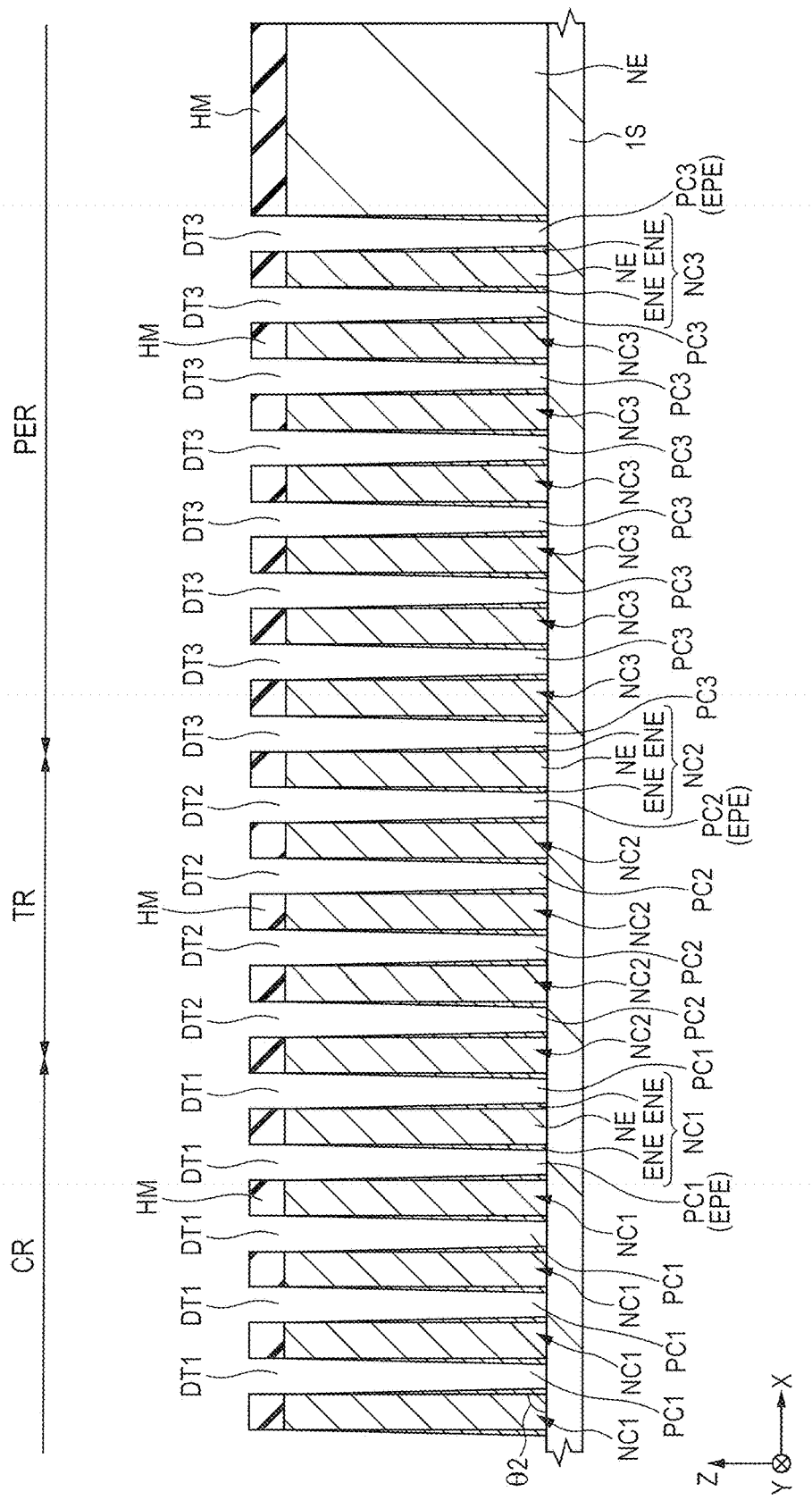
FIG. 15 is a sectional view illustrating the manufacturing process of the semiconductor device of the first embodiment, showing a step following FIG. 13.

Subsequently, as shown in FIG. 15, the tapered embedded n-type epitaxial film ENE is formed on each of the side faces of the trenches (DT1 to DT3). For example, an epitaxial layer made of silicon is grown while the n-type impurity is introduced. At this time, the film is formed while a silicon etching gas (for example, HCl) is introduced together with a silicon compound (for example, $SiH_4$) as a source gas, thereby the tapered embedded n-type epitaxial film ENE can be formed. Consequently, the embedded n-type epitaxial film ENE has a small thickness (t1) on the upper side of the side face of the trench while having a large thickness on the lower side of the side face of the trench (t2>t1). The thickness (t1, t2) described herein refers to the width (length) in the X direction shown in FIG. 15. An angle θ2 between the side face of the embedded n-type epitaxial film ENE and the surface of the semiconductor substrate 1S is preferably 80° to less than 89°, for example.

The n-type column regions (NC1 to NC3) are formed through the above steps, and each includes a substantially quadrangular columnar vertical section, which includes the epitaxial layer NE remaining between the trenches DT1, DT2, or DT3, and a tapered section including the tapered embedded n-type epitaxial film ENE disposed on the side face of the vertical section. In other words, the n-type column regions (NC1 to NC3) each include the substantially quadrangular columnar vertical section including the epitaxial layer NE and the tapered section including the tapered embedded n-type epitaxial film ENE disposed on the side face of the vertical section. The embedded n-type epitaxial film ENE has an n-type impurity concentration of, for example, about $3.3 \times 10^{15}/cm^3$. The concentration of the embedded n-type epitaxial film ENE can be adjusted by adjusting a flow rate of the n-type impurity to be introduced.

Figure 16:
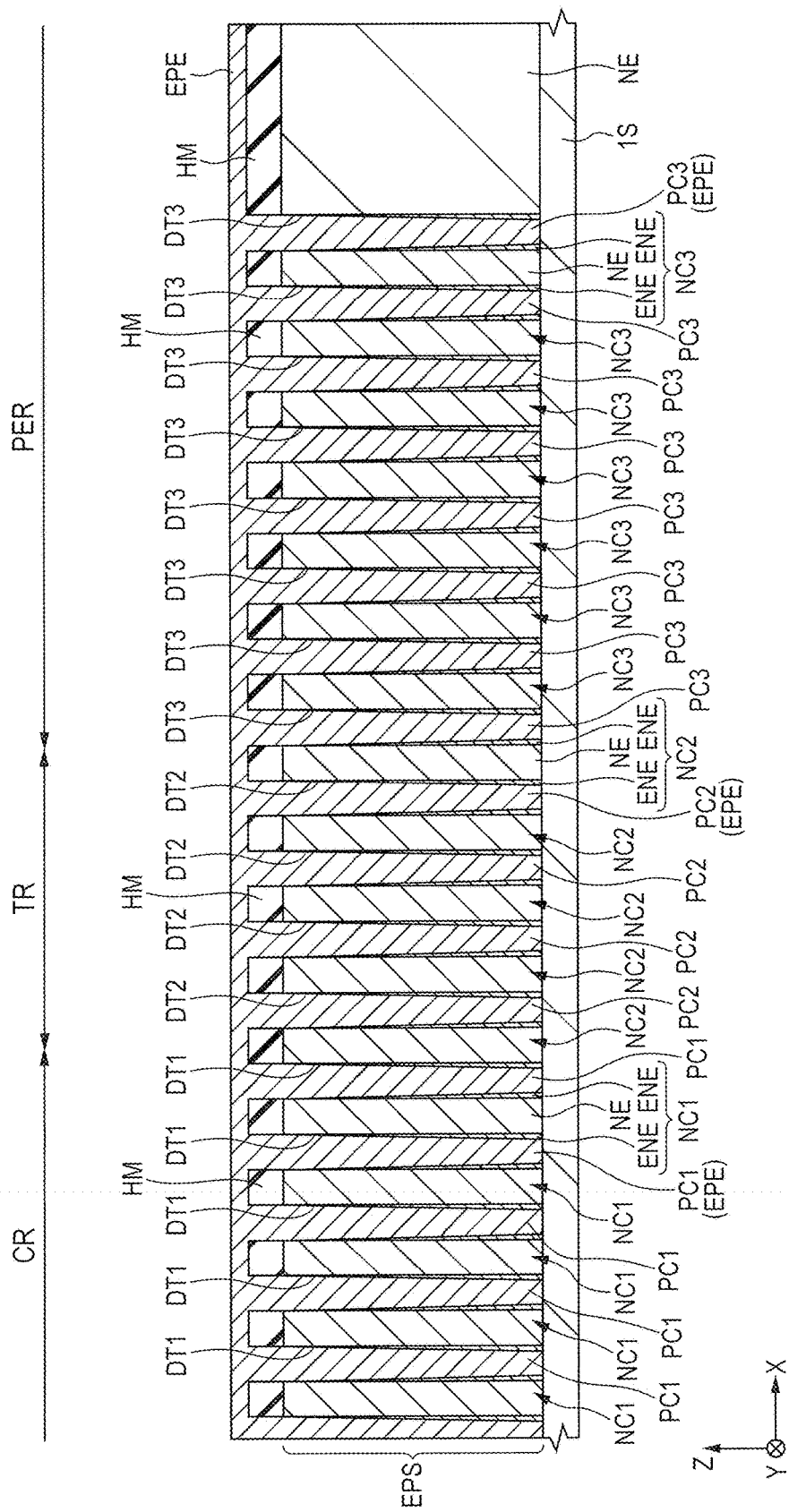
FIG. 16 is a sectional view illustrating the manufacturing process of the semiconductor device of the first embodiment, showing a step following FIG. 15.

Subsequently, as shown in FIG. 16, the embedded p-type epitaxial film EPE is formed within each of the trenches DT1, DT2, and DT3 and on the epitaxial layer NE by an epitaxial growth process. Specifically, the impurity to be introduced is switched from the n-type impurity to a p-type impurity, and the epitaxial layer is grown while the p-type impurity is introduced. At this time, the embedded p-type epitaxial film EPE is grown so as to cover the bottom faces of the trenches DT1, DT2, and DT3 and the side faces of the embedded n-type epitaxial films ENE, and thus fills the insides of the trenches DT1, DT2, and DT3. The embedded p-type epitaxial film EPE is also grown over the hard mask HM located between the trenches DT and over the trenches DT1, DT2, and DT3 that have been filled. The embedded p-type epitaxial film EPE has a p-type impurity concentration of, for example, about $6.0 \times 10^{15}/cm^3$.

Figure 17:
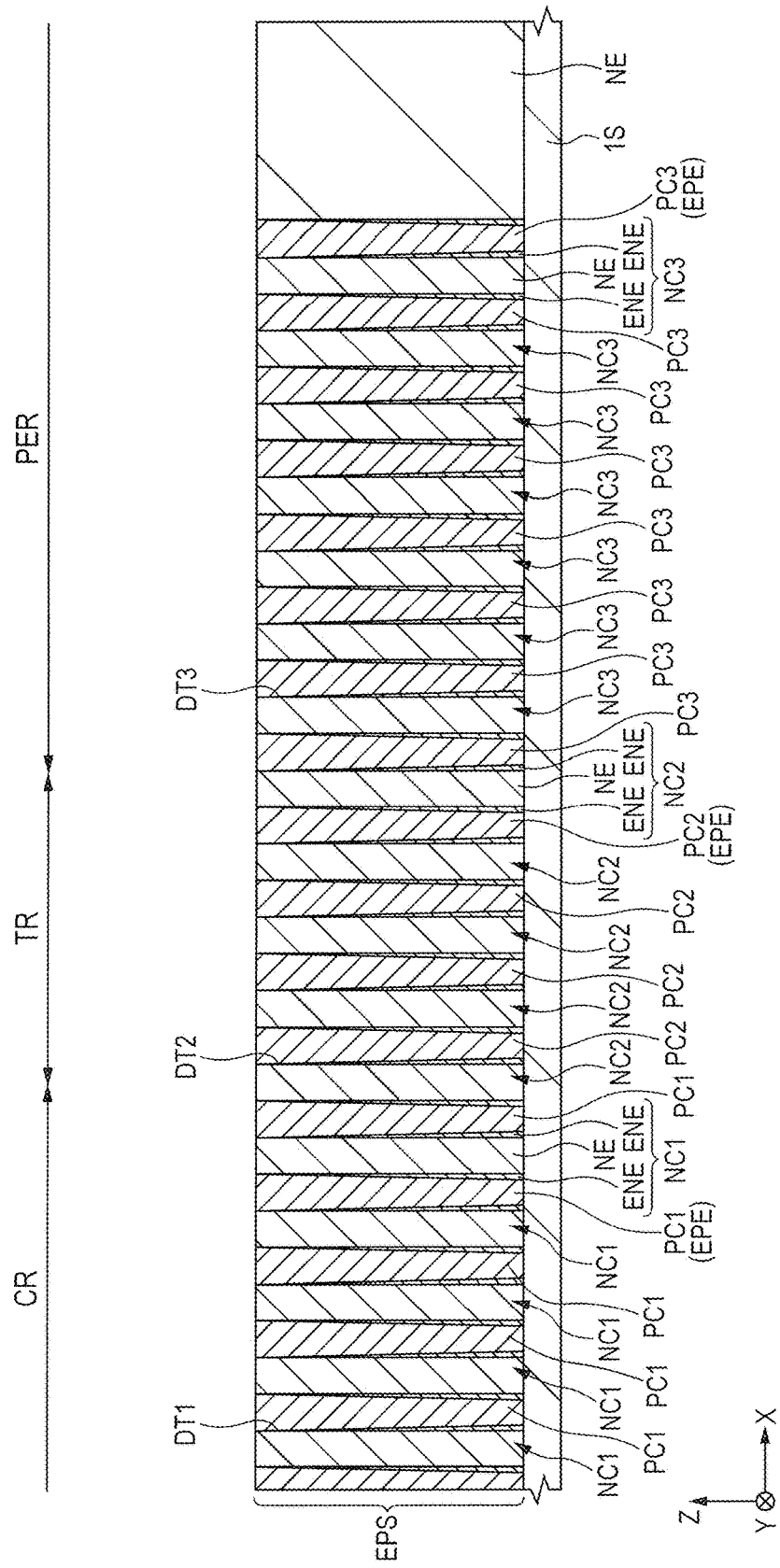
FIG. 17 is a sectional view illustrating the manufacturing process of the semiconductor device of the first embodiment, showing a step following FIG. 16.

Subsequently, as shown in FIG. 17, the embedded p-type epitaxial film EPE over the trenches DT1, DT2, and DT3 and the hard mask HM are removed by a CMP process, an etching process, and the like, thereby the insides of the trenches DT1, DT2, and DT3 are filled with the embedded n-type epitaxial film ENE and the embedded p-type epitaxial film EPE. As a result, the p-type column regions PC1, PC2, and PC3 including the embedded p-type epitaxial film EPE are formed. In other words, the epitaxial layer EPS, which includes the p-type column regions PC1, PC2, and PC3 and the n-type column regions NC1, NC2, and NC3, is formed.

Figure 18:
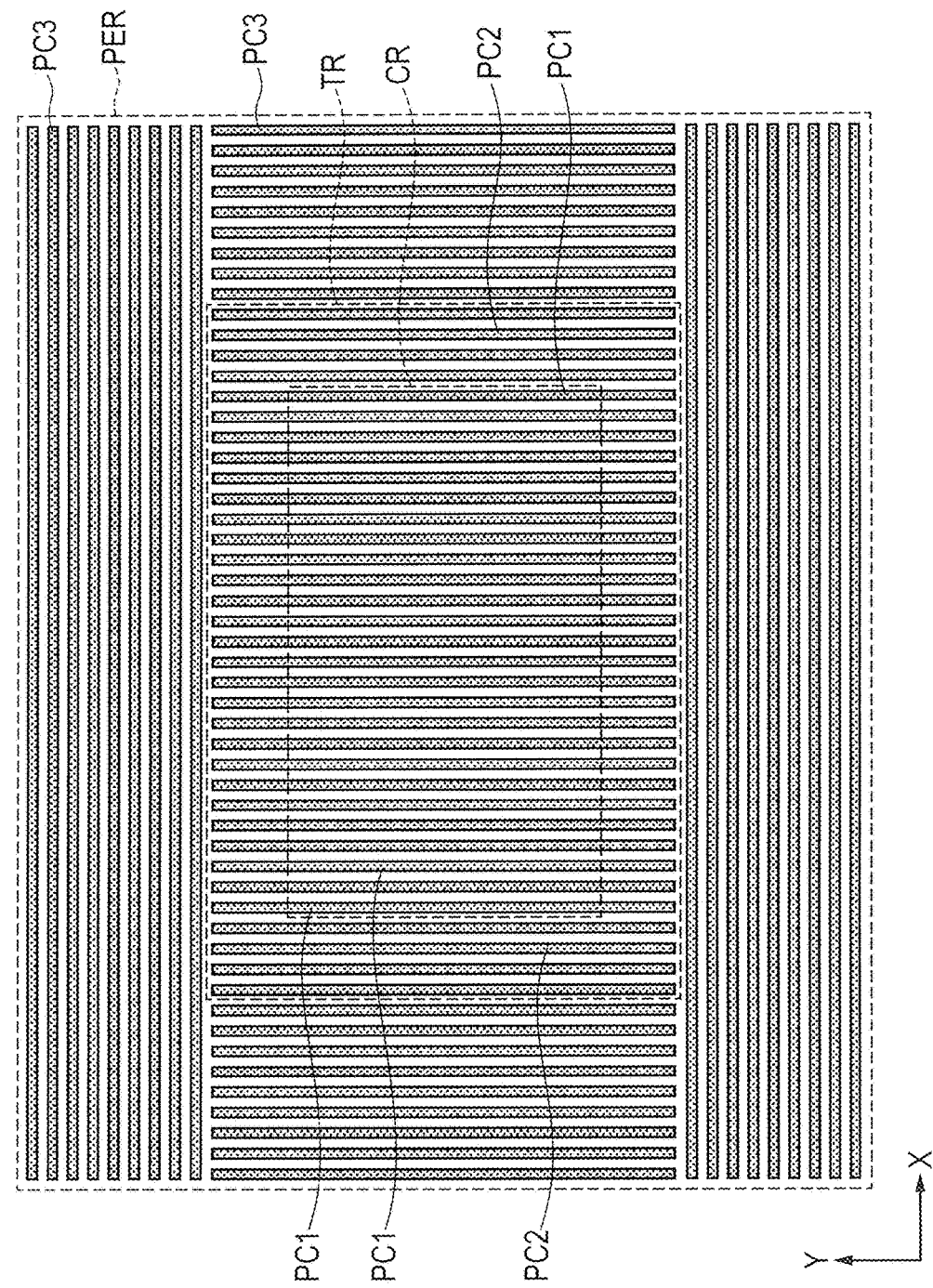
FIG. 18 is a plan view illustrating the manufacturing process of the semiconductor device of the first embodiment.

Through the above steps, structures are formed in the cell region CR and the intermediate region TR. In the respective structures, the linear p-type column regions PC1 and PC2 extending in the Y direction and the linear n-type column regions NC1 and NC2 extending in the Y direction are alternately and periodically arranged in the X direction. Two structures are formed in the peripheral region PER. In one structure, the linear p-type column regions PC3 extending in the Y direction and the linear n-type column regions NC3 extending in the Y direction are alternately and periodically arranged in the X direction (FIG. 18). In the other structure, the linear p-type column regions PC3 extending in the X direction and the linear n-type column regions NC3 extending in the X direction are alternately and periodically arranged in the Y direction (FIG. 18).

Subsequently, the power MOSFET, the gate lead section GPU, the gate lead electrode GPE, the source lead region SPR, the source lead electrode SPE, the field plate electrode FFP, and the like are formed on the main surface of the epitaxial layer EPS.

Figure 19:
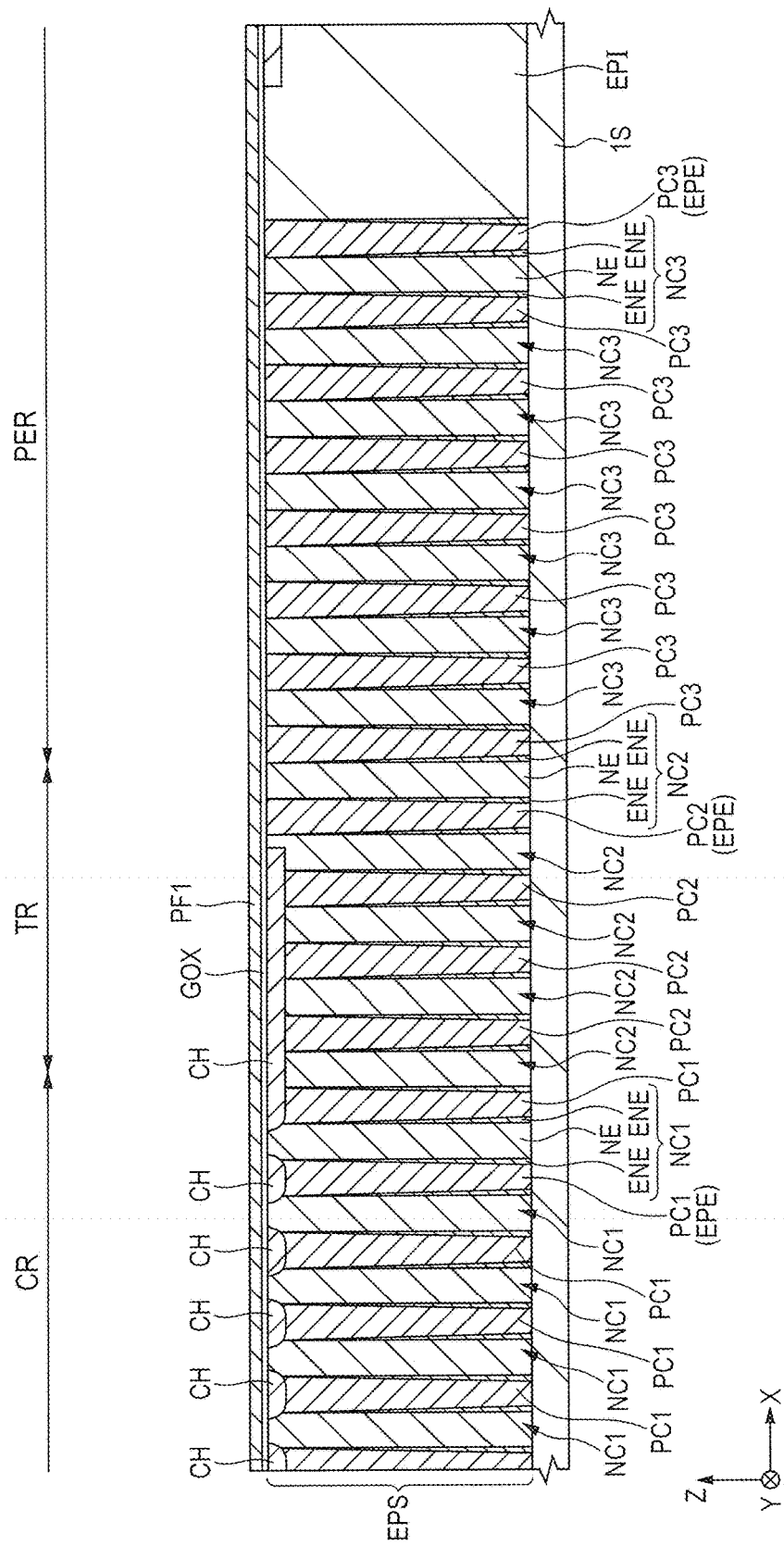
FIG. 19 is a sectional view illustrating the manufacturing process of the semiconductor device of the first embodiment, showing a step following FIG. 17.

For example, as shown in FIG. 19, the channel regions CH are formed. For example, a mask film having an opening in a forming region of the channel region CH is formed using a photolithography technique and an etching technique. Subsequently, the channel regions CH are formed through impurity ion implantation with the mask film as a mask. For example, a p-type impurity ion including boron (B) is implanted as the impurity ion. Consequently, p-type semiconductor regions to be the channel regions CH can be formed.

Subsequently, the mask film is removed, the gate insulating film GOX is formed on the epitaxial layer EPS, and the conductor film PF1 is formed on the gate insulating film GOX. For example, a surface of the epitaxial layer EPS is thermally oxidized to form a silicon oxide film as the gate insulating film GOX. Subsequently, a polycrystalline silicon film is deposited on the silicon oxide film by a CVD process or the like. A high-dielectric-constant film, having a dielectric constant higher than the silicon oxide film, such as a hafnium oxide film may be used as the gate insulating film GOX in place of the silicon oxide film. The gate insulating film GOX may be formed by a CVD process or the like.

Figure 20:
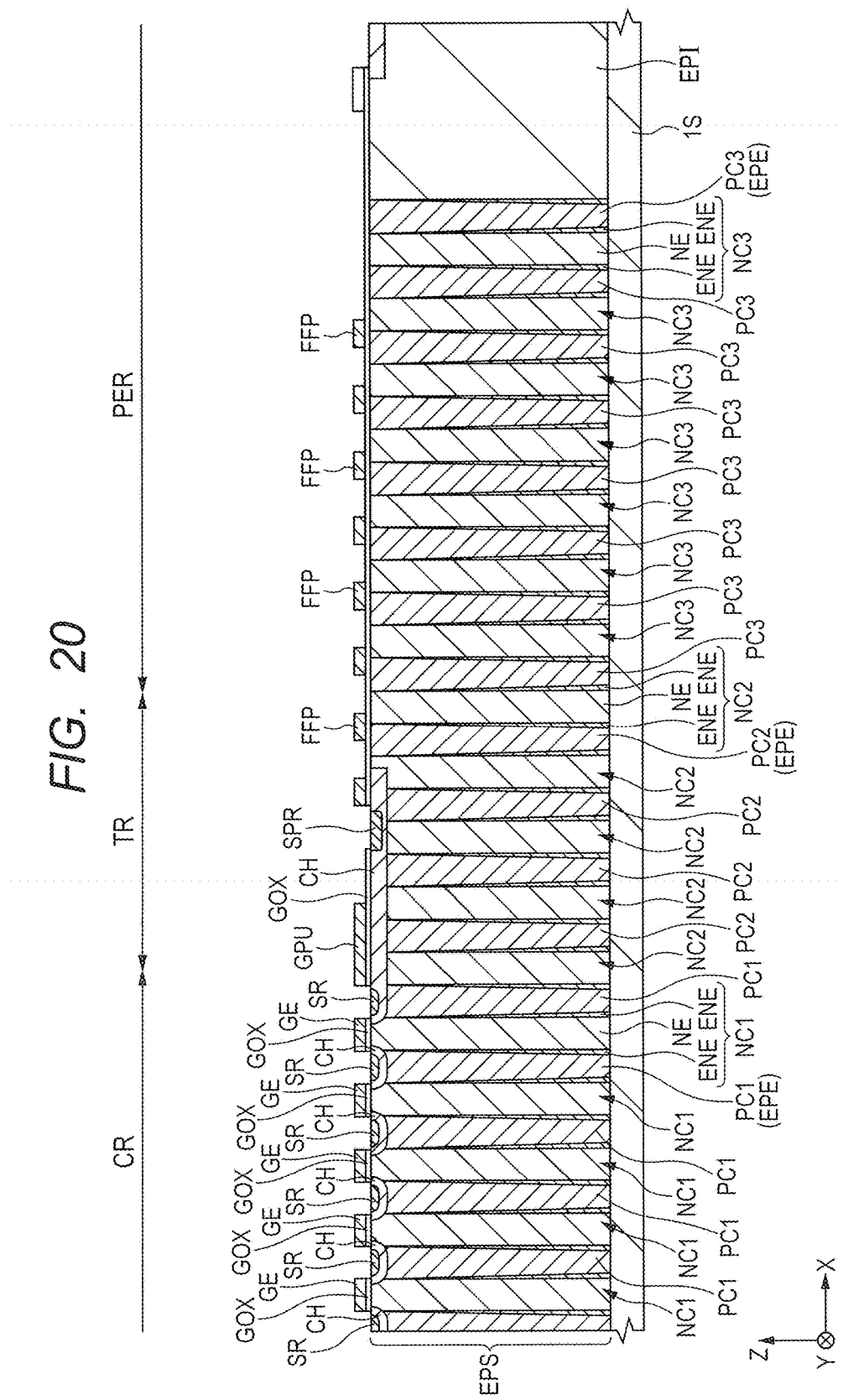
FIG. 20 is a sectional view illustrating the manufacturing process of the semiconductor device of the first embodiment, showing a step following FIG. 19.
Figure 21:
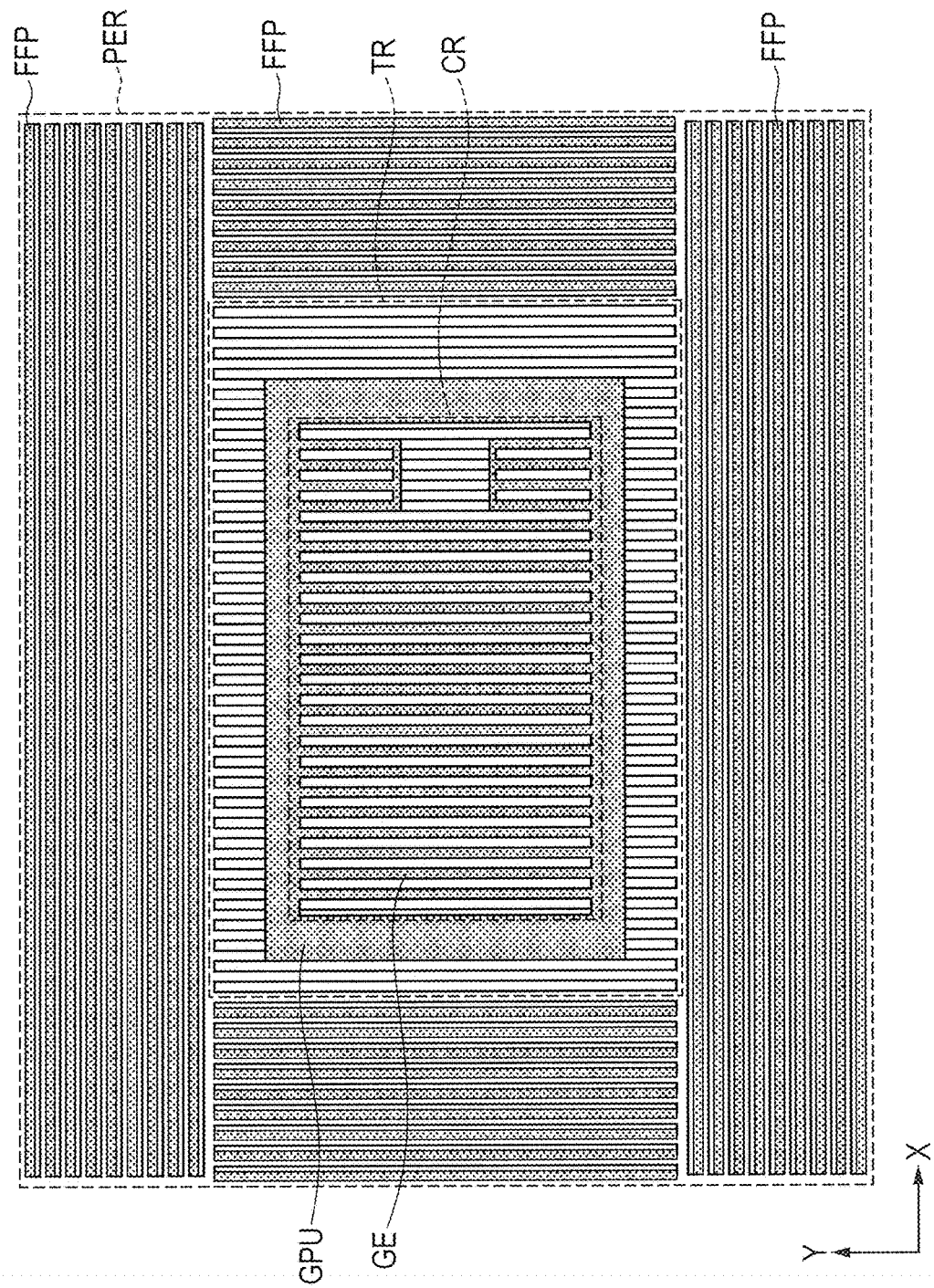
FIG. 21 is a plan view illustrating the manufacturing process of the semiconductor device of the first embodiment.

Subsequently, as shown in FIG. 20, the gate electrodes GE are formed on the n-type column regions NC1. The gate lead section GPU is formed in the intermediate region TR. The field plate electrodes FFP are formed on respective pn junctions between the p-type column regions PC3 and the n-type column regions NC3. For example, a photoresist film, which covers a forming region of the gate electrode GE, a forming region of the gate lead section GPU, and a forming region of the field plate electrode FFP, is formed on the conductor film PF1, and the conductor film PF1 is etched using the photoresist film as a mask. Consequently, the gate electrodes GE and the field plate electrodes FFP are formed. For example, as shown in FIG. 21, each gate electrode GE is formed in a linear shape as with the p-type column region PC1, and the gate lead section GPU is formed so as to be electrically coupled to the gate electrodes GE. The field plate electrode FFP are each formed in a linear shape as with the p-type column region PC3.

Subsequently, the source regions SR and the source lead region SPR are formed. For example, any region other than a forming region of the source lead region SPR in each of the peripheral region PER and the intermediate region TR is covered by an undepicted photoresist film, and the n-type impurity ion is implanted using the photoresist film and the gate electrodes GE in the cell region CR as a mask. For example, an n-type impurity ion including phosphorus (P) or arsenic (As) is implanted as the impurity ion. Consequently, n-type semiconductor regions to be the source regions SR can be formed between the gate electrodes GE in the cell region CR. An n-type semiconductor region to be the source lead region SPR can also be formed in the intermediate region TR. The source regions SR formed in the cell region CR are electrically coupled to the source lead region SPR formed in the intermediate region TR.

Figure 22:
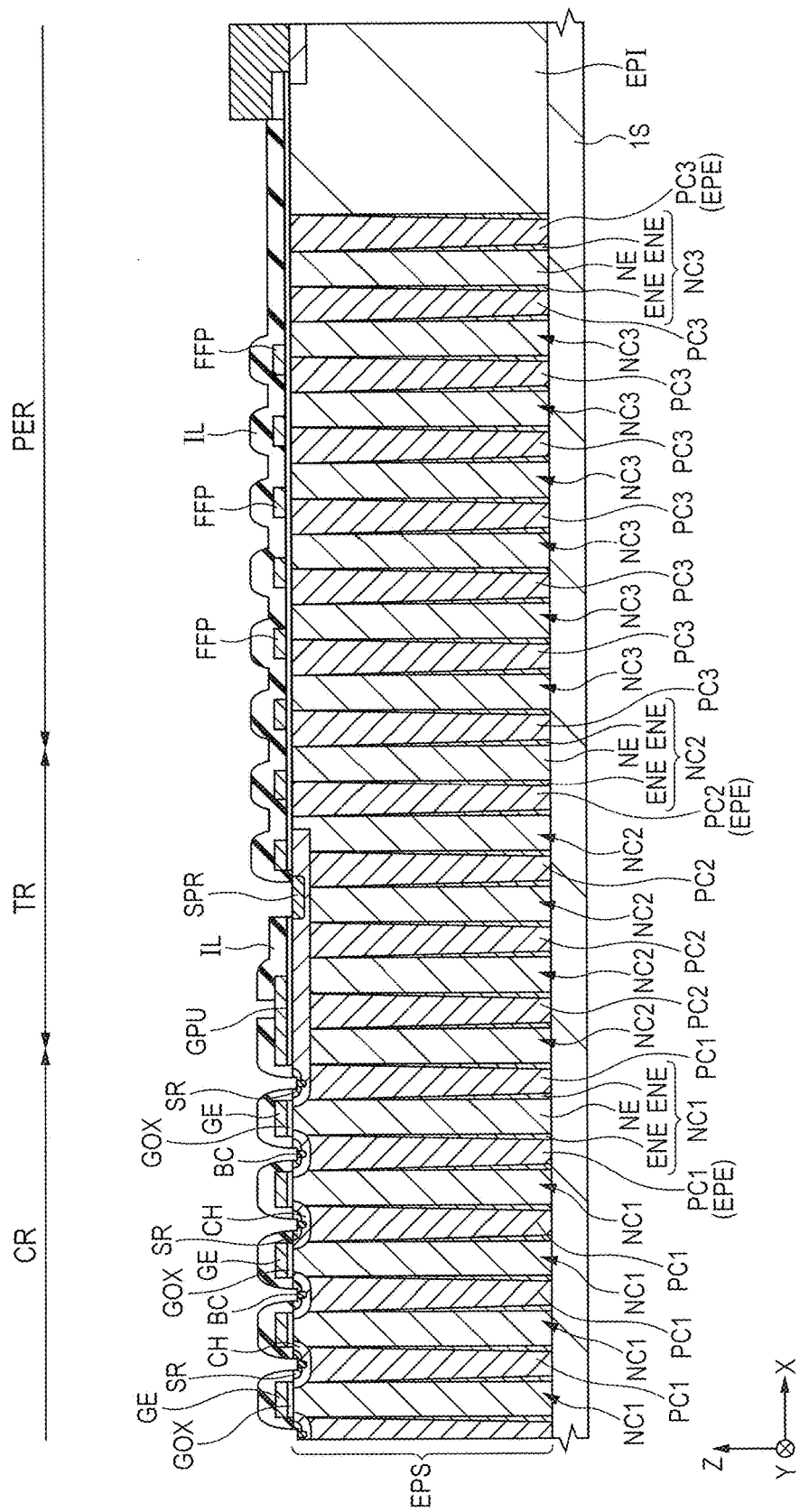
FIG. 22 is a sectional view illustrating the manufacturing process of the semiconductor device of the first embodiment, showing a step following FIG. 20.

Subsequently, as shown in FIG. 22, the interlayer insulating film IL, which covers the gate electrodes GE, the gate lead section GPU, and the field plate electrodes FFP, is formed. For example, a silicon oxide film is deposited on the gate electrodes GE and the like by a CVD process. Subsequently, an undepicted photoresist film is formed on the interlayer insulating film IL, the photoresist film having openings over forming regions of the body contact regions BC, the gate lead section GPU, and the source lead region SPR. Subsequently, the interlayer insulating film IL on each source region SR located between the adjacent gate electrodes GE in the cell region CR is etched using the photoresist film as a mask, and thus an opening is formed. At this time, overetching is performed such that a bottom of the opening is lower than a surface of the epitaxial layer EPS. Consequently, the source region SR is exposed from a side face of the bottom portion of the opening. The interlayer insulating film IL over each of the gate lead section GPU and the source lead region SPR in the intermediate region TR is etched to form openings.

Subsequently, a photoresist film covering the intermediate region TR and the peripheral region PER is formed, and impurity ion is implanted using the photoresist film and the interlayer insulating film IL as a mask, thereby the body contact regions BC are formed. For example, a p-type impurity ion including boron (B) is implanted as the impurity ion. Consequently, p-type semiconductor regions to be the body contact regions BC can be formed. Each body contact region BC is located in the middle of the source region SR, and extends such that its bottom reaches the channel region CH. The body contact region BC has an impurity concentration higher than the channel region CH.

Figure 23:
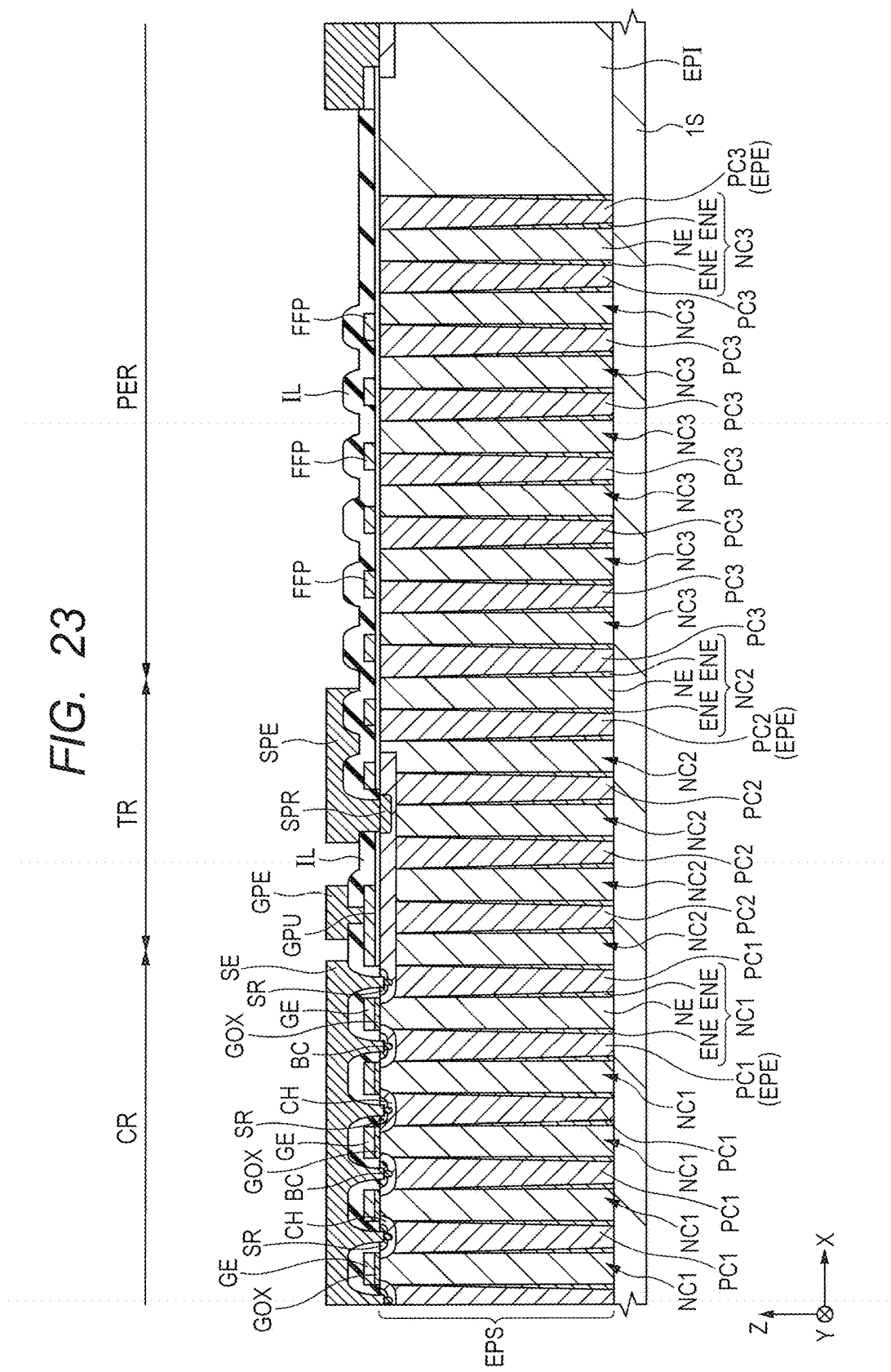
FIG. 23 is a sectional view illustrating the manufacturing process of the semiconductor device of the first embodiment, showing a step following FIG. 22.
Figure 24:
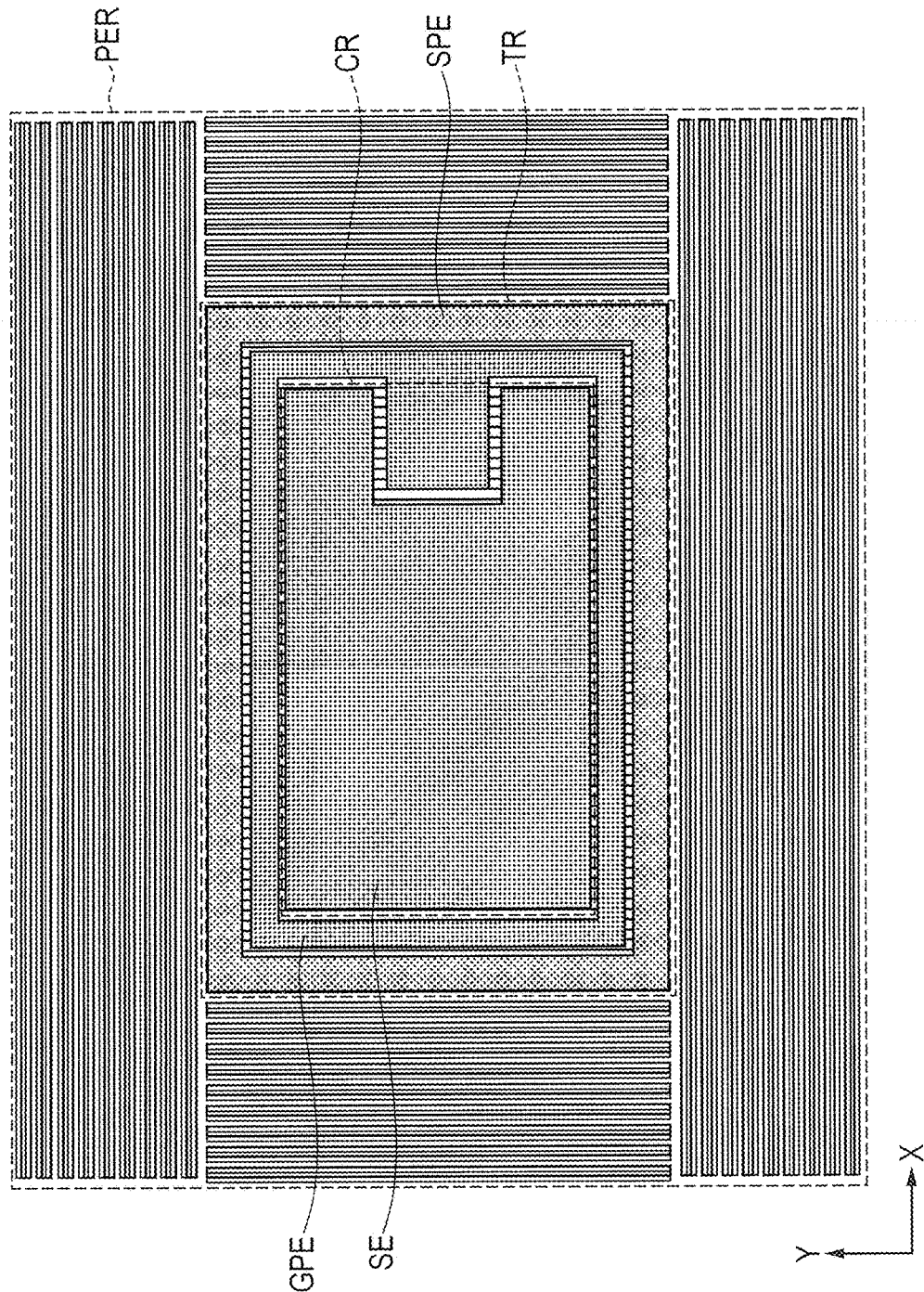
FIG. 24 is a plan view illustrating the manufacturing process of the semiconductor device of the first embodiment.

Subsequently, as shown in FIGS. 23 and 24, the source electrodes SE, the gate lead electrode GPE, and the source lead electrode SPE are formed. For example, a metal film is formed on the interlayer insulating film IL including over the body contact regions BC, the gate lead section GPU, and the source lead region SPR. For example, a stacked film of a titanium tungsten film and an aluminum film on the titanium tungsten film is formed by a sputtering process or the like. Subsequently, the metal film is patterned to form the source electrodes SE, the gate lead electrode GPE, and the source lead electrode SPE. The source electrodes SE in the cell region CR are each electrically coupled to the source region SR and the body contact region BC. The gate lead electrode GPE in the intermediate region TR is electrically coupled to the gate lead section GPU. The source lead electrode SPE in the intermediate region TR is electrically coupled to the source lead region SPR.

Figure 25:
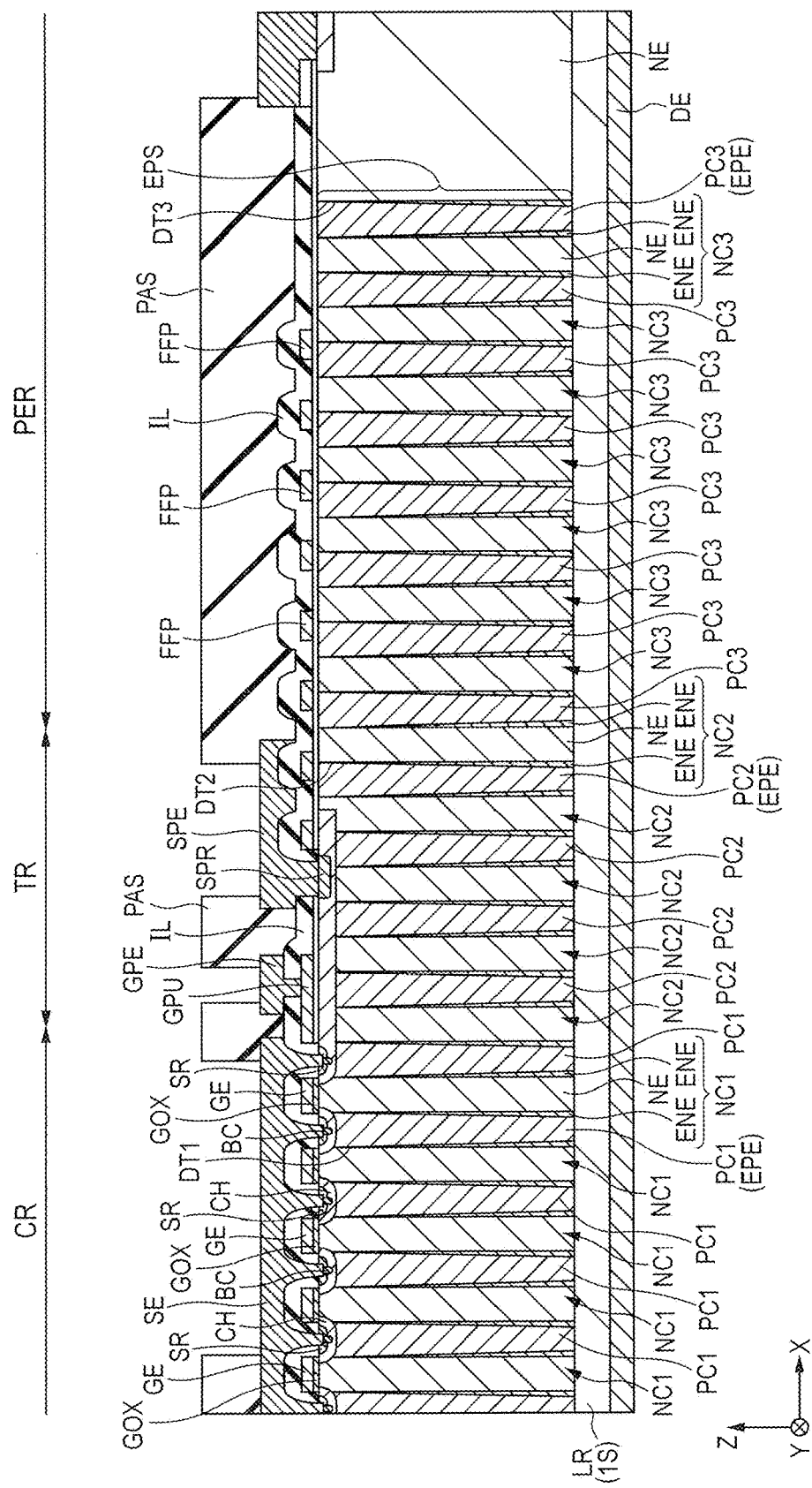
FIG. 25 is a sectional view illustrating the manufacturing process of the semiconductor device of the first embodiment, showing a step following FIG. 23.

Subsequently, as shown in FIG. 25, the surface protective film PAS is formed so as to cover the source electrodes SE, the gate lead electrode GPE, and the source lead electrode SPE. For example, a silicon oxide film is deposited by a CVD process on the source electrodes SE, the gate lead electrode GPE, the source lead electrode SPE, and the like. Subsequently, the surface protective film PAS is patterned to expose a partial region of each source electrode SE, a partial region of the gate leading electrode GPE, and a partial region of the source lead electrode SPE. Such exposed portions become external coupling regions (e.g., a gate pad and a source pad).

Subsequently, a back, which corresponds to a side (bottom side of the trench) opposite to the main surface of the semiconductor substrate 1S, is ground while being set to be a top. For example, the back of the semiconductor substrate 1S is ground such that the sum of thickness of the semiconductor substrate 1S and thickness of the epitaxial layer EPS is about 50 to 60 μm, and thus the semiconductor substrate 1S is thinned. Through such grinding, a distance between the back of the semiconductor substrate 1S and the bottom face of the trench (DT1, DT2, or DT3) becomes about 3 to 5 μm.

Subsequently, an n-type impurity ion is implanted into the entire back of the semiconductor substrate 1S to form the n-type semiconductor region (low resistance region) LR. The n-type semiconductor region LR is thus formed, making it possible to reduce a coupling resistance between the drain electrode DE and the n-type column region (NC1, NC2, or NC3) as described later. The n-type semiconductor region (low resistance region) LR extends from the back of the semiconductor substrate 1S to the bottom of the trench (DT1, DT2, or DT3), and has an n-type impurity concentration of, for example, about $1.0 \times 10^{16}/cm^3$.

Subsequently, the drain electrodes DE are formed on the back of the semiconductor substrate 1S. For example, a metal film is formed by a sputtering process or an evaporation process while a back side of the semiconductor substrate 1S is set to be a top. Consequently, the drain electrodes DE each including the metal film can be formed.

The semiconductor device of the first embodiment can be formed through the above steps.

Second Embodiment

In the first embodiment, the tapered embedded n-type epitaxial film ENE is formed while the n-type impurity is introduced. That is, the n-type impurity introduced in a chamber (processing chamber) is further introduced into the epitaxial film so that the embedded n-type epitaxial film ENE is formed. However, an autodoping phenomenon may be used to form the tapered embedded n-type epitaxial film ENE.

Figure 26:
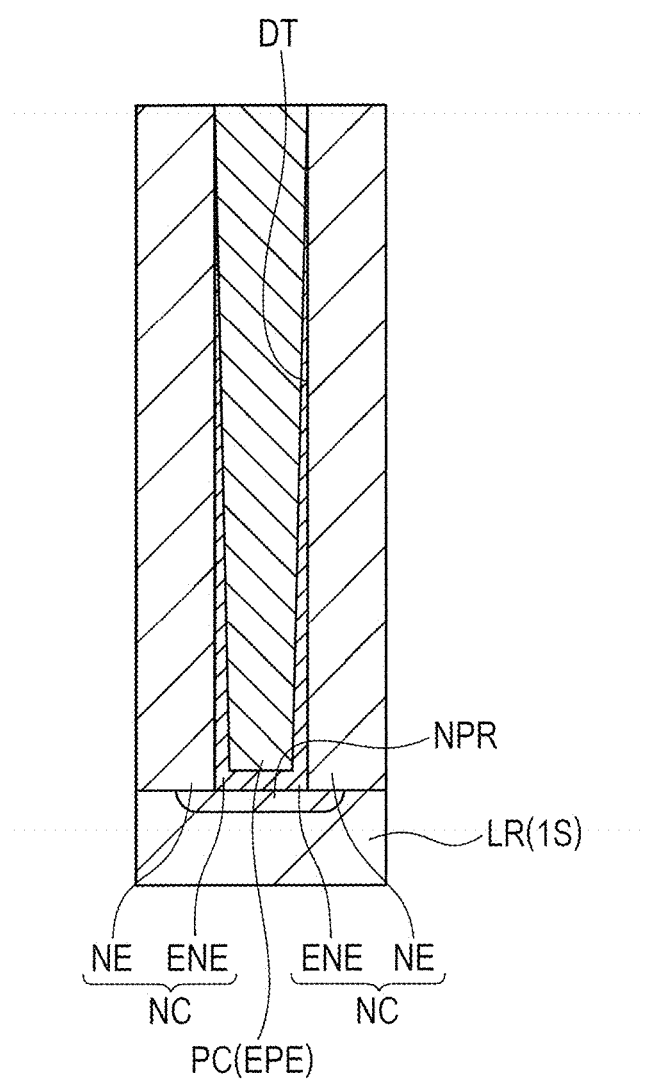
FIG. 26 is an enlarged view of a p-type column region with its vicinity of a second embodiment.
Figure 28:
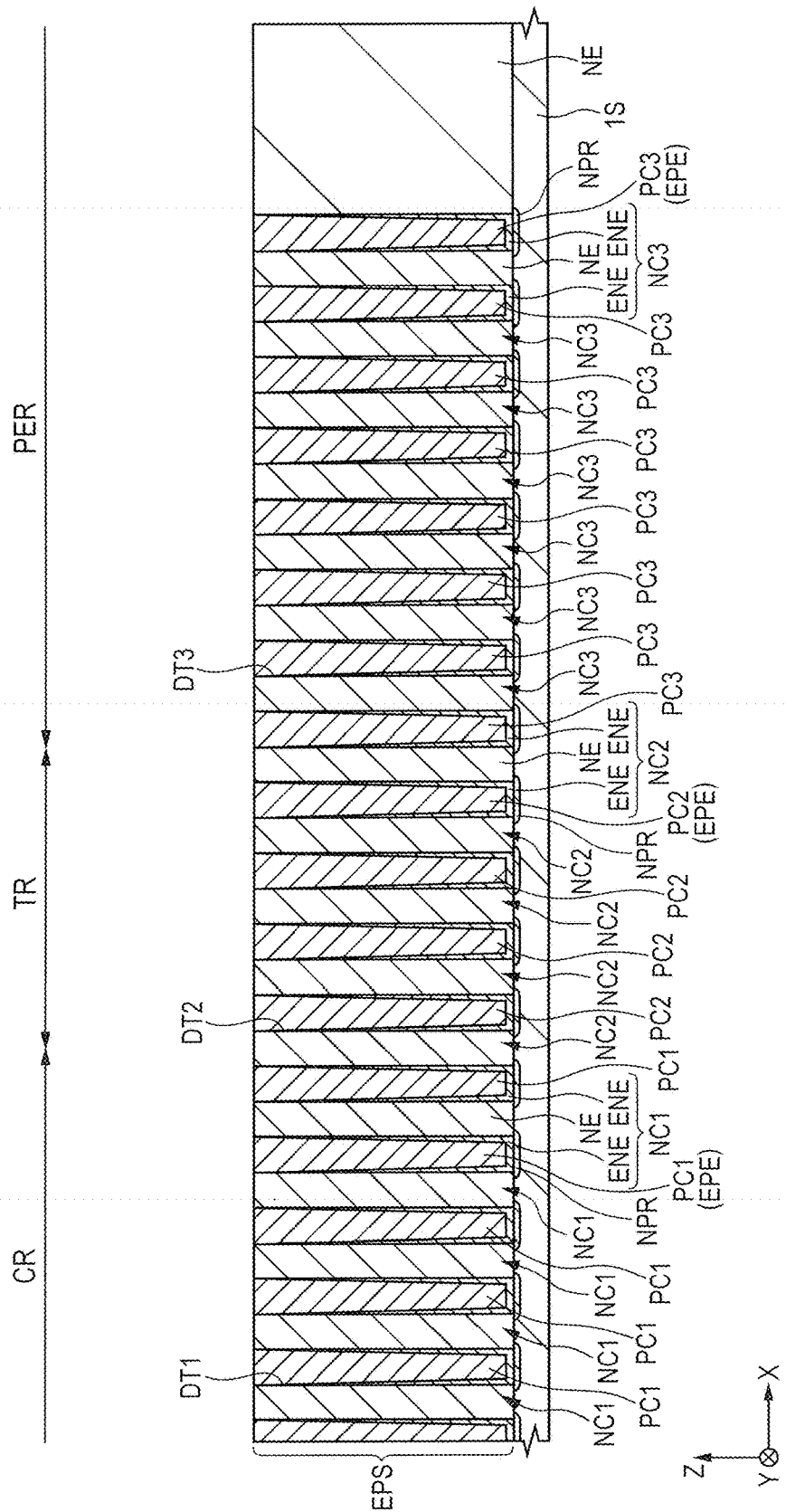
FIG. 28 is a sectional view illustrating a superjunction structure of the second embodiment.

FIG. 26 is an enlarged view of a p-type column region with its vicinity of a second embodiment. FIGS. 27A to 27D are sectional views illustrating a formation process of a superjunction structure of the second embodiment. FIG. 28 is a sectional view illustrating the superjunction structure of the second embodiment. A configuration of a power MOSFET over the superjunction structure, a layout of the p-type column regions, and a layout of the n-type column regions are the same as those in the first embodiment.

In the second embodiment, as shown in FIGS. 26 and 28, the n-type column regions (NC1 to NC3) each have the vertical section including the epitaxial layer NE and the tapered section including the tapered, embedded n-type epitaxial film ENE disposed on a side face of the vertical section. The n-type column regions (NC1 to NC3) each have a regular trapezoidal shape in which an upper base is smaller than a lower base. The p-type column regions (PC1 to PC3) each have an inverted trapezoidal shape in which an upper base is larger than a lower base.

In the second embodiment, a high-concentration n-type semiconductor region NPR is provided at a bottom portion of the p-type column region PC. The high-concentration n-type semiconductor region NPR is a source of an n-type impurity in the embedded n-type epitaxial film ENE. The high-concentration n-type semiconductor region NPR is thus provided, thereby an autodoping phenomenon is achieved. That is, an n-type impurity is diffused from the high-concentration n-type semiconductor region NPR and is allowed to be introduced into the tapered embedded n-type epitaxial film ENE. Specifically, autodoping of As is easy because of its high solid phase diffusion coefficient, and thus As is preferably used as an n-type impurity for autodoping.

For example, as shown in FIG. 27A, the semiconductor substrate 1S having a main surface (surface, top), on which the epitaxial layer NE including the n-type semiconductor layer is provided, is etched using the hard mask HM having a desired shape as a mask, thereby the trench DT is formed. For example, the trench DT has an opening width of about 4 μm and a depth (D) of about 50 μm. An angle (θ1) between a side face of the trench DT and the surface of the semiconductor substrate 1S is 89° to 90°. In this way, there is formed the trench DT that has a high aspect ratio (10 or more) and provides a substantially vertical angle θ1 between the side face of the trench DT and the surface of the semiconductor substrate 1S. The Bosch process described in the first embodiment is preferably used as an etching process for forming such a trench DT.

Subsequently, as shown in FIG. 27B, an n-type impurity ion such as As is implanted into the bottom of the trench DT to form a high concentration n type semiconductor region NPR. Subsequently, the tapered embedded n-type epitaxial film ENE is formed on the side face of the trench DT. For example, an epitaxial layer made of silicon is grown. At this time, the tapered embedded n-type epitaxial film ENE can be formed by introducing a silicon etching gas together with a silicon compound as a source gas. In the second embodiment, since the high-concentration n-type semiconductor region NPR is provided at the bottom of the trench DT, even if silicon is grown without introducing the n-type impurity, the film on the side face of the trench DT is autodoped with the n-type impurity. As a result, the tapered embedded n-type epitaxial film ENE can be formed.

Even if silicon is grown while a p-type impurity is introduced, since the film on the side face of the trench DT is autodoped with the n-type impurity, the p-type impurity is offset by the n-type impurity. In case of a high autodoping concentration of the n-type impurity, the film on the side face of the trench DT has an n-type conductivity. As the film is further formed on the bottom face of the trench DT, autodoping of the n-type impurity from the high-concentration n-type semiconductor region NPR is gradually suppressed and eventually automatically stopped. In this way, the embedded p-type epitaxial film EPE can be formed within the trench DT while the tapered embedded n-type epitaxial film ENE is formed (FIG. 27C). Specifically, the epitaxial layer is merely grown while the p-type impurity is introduced without switching the impurity to be introduced, which makes it possible to continuously form the tapered embedded n-type epitaxial film ENE with autodoping and the embedded p-type epitaxial film EPE within the trench DT. The high-concentration n-type semiconductor region NPR has an n-type impurity concentration higher than at least an n-type impurity concentration of the epitaxial layer NE, for example, about $8.0 \times 10^{15}/cm^3$. The tapered embedded n-type epitaxial film ENE formed with autodoping has an n-type impurity concentration of, for example, about $5.0 \times 10^{15}/cm^3$. Such an n-type impurity concentration of the embedded n-type epitaxial film ENE is an average concentration, and may have a concentration gradient such that the impurity concentration is high in the vicinity of the sidewall of the trench DT but lower at a greater distance from the sidewall, for example. The embedded p-type epitaxial film EPE has a p-type impurity concentration of, for example, about $3.0 \times 10^{15}/cm^3$.

It will be appreciated that the embedded p-type epitaxial film EPE may be formed while the p-type impurity is introduced after the embedded n-type epitaxial film ENE is formed without introducing an impurity.

Subsequently, the embedded p-type epitaxial film EPE over the trench DT and the hard mask HM are removed by a CMP process, an etching process, and the like. Consequently, a superjunction structure including the p-type column region PC and the n-type column region NC is formed (see FIG. 28).

As described above, in the second embodiment, autodoping can be used to easily provide the tapered section including the embedded n-type epitaxial film ENE on the sidewall of each of the trenches DT (DT1 to DT3). As described in detail in the first embodiment, the tapered section including the embedded n-type epitaxial film ENE is provided, thereby the p-type column regions PC1 to PC3 are each allowed to have an inverted trapezoidal shape, leading to an increase in the margin for a variation in the p-type impurity concentration of the p-type column region PC1. In addition, on resistance can be reduced by lateral diffusion of the n-type impurity (for example, As).

Application

In the configuration shown in FIGS. 26 to 28, a source of the tapered embedded n-type epitaxial film ENE is the high-concentration n-type semiconductor region NPR formed on the bottom face of the trench DT. However, the high-concentration n-type semiconductor region NPR may be provided at any position without limitation, for example, in a scribe region or a test pattern region (TEG region). The high concentration n-type semiconductor region NPR provided in such a region may be referred to as dummy shot.

In a wafer-like semiconductor substrate having a plurality of chip regions, a substantially rectangular area between chip regions is referred to as scribe region, and the semiconductor substrate can be individualized into chips by cutting the semiconductor substrate along the scribe region.

Figure 29:
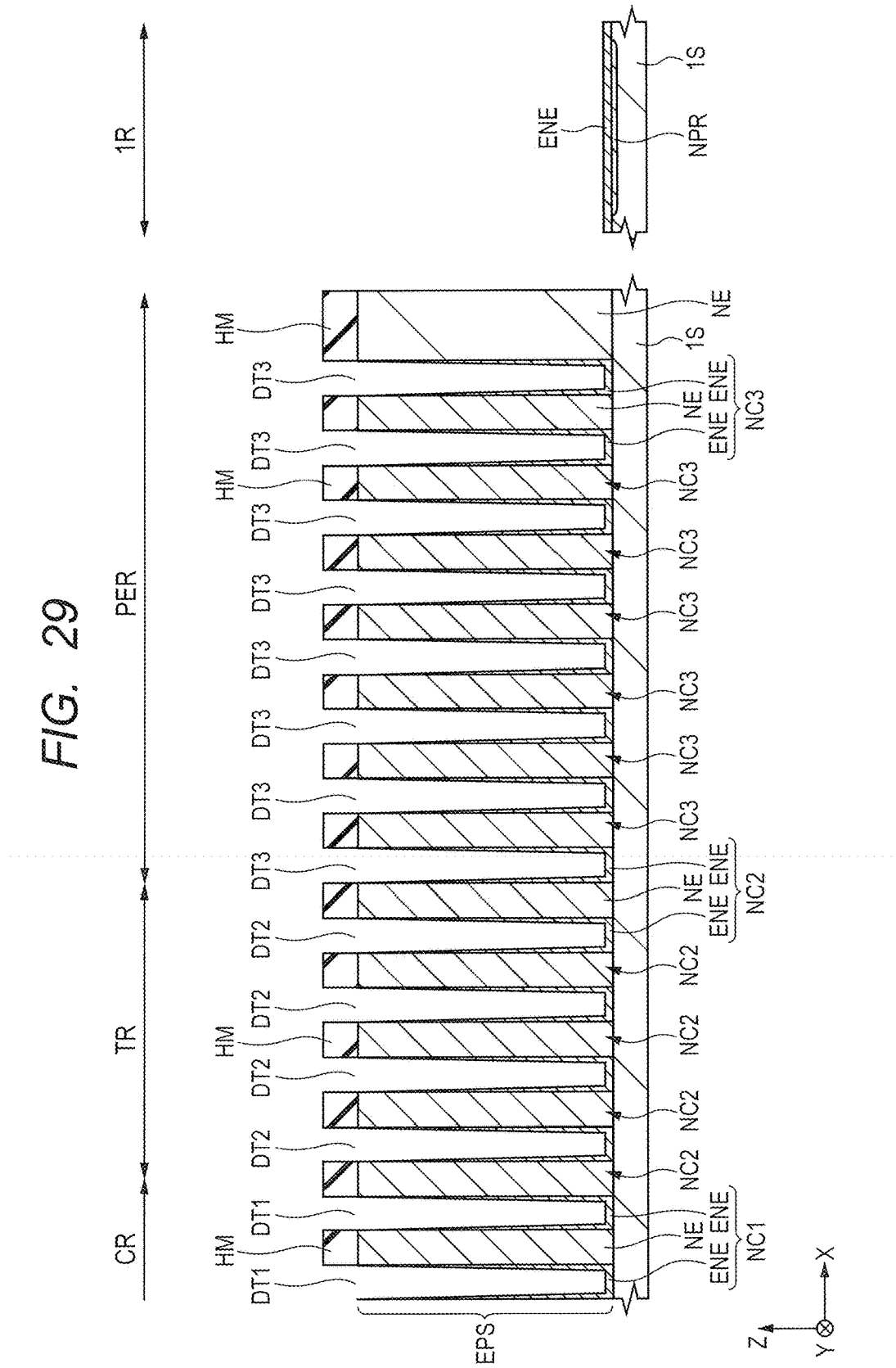
FIG. 29 is a sectional view illustrating a superjunction structure of an application of the second embodiment.

The high-concentration n-type semiconductor region NPR may be provided in such a scribe region or a test pattern region (TEG region). FIG. 29 is a sectional view illustrating a superjunction structure of an application of the second embodiment. As shown in FIG. 29, the high-concentration n-type semiconductor region NPR is provided in a region 1R (for example, scribe region or test pattern region). For example, the n-type impurity such as As is implanted into the surface of the semiconductor substrate 1S to form the high-concentration n-type semiconductor region NPR. Subsequently, the tapered embedded n-type epitaxial film ENE is formed using diffusion (autodoping) of the n-type impurity from the high-concentration n-type semiconductor region NPR. At this time, the embedded n-type epitaxial film ENE is also formed on the high-concentration n-type semiconductor region NPR, and thus autodoping of the n-type impurity is automatically stopped.

The high concentration n-type semiconductor region NPR may be formed at any timing without limitation, and should be exposed before a step of forming the tapered embedded n-type epitaxial film ENE. The high-concentration n-type semiconductor region NPR may be formed in the semiconductor substrate 1S or in the epitaxial layer NE.

As described above, in this application, autodoping can also be used to easily provide the tapered section including the embedded n-type epitaxial film ENE on each of the sidewalls of the trenches DT (DT1 to DT3). As described in detail in the first embodiment, the tapered section including the embedded n-type epitaxial film ENE is provided, thereby the p-type column regions PC1 to PC3 are each allowed to have an inverted trapezoidal shape, leading to an increase in margin for a variation in p-type impurity concentration of each of the p-type column regions PC1 to PC3. In addition, on resistance can be reduced by lateral diffusion of the n-type impurity (for example, As)

In this way, the diffused n-type impurity is introduced into an epitaxial growth atmosphere even from a region away from the trenches DT1 to DT3. Hence, although the high-concentration n-type semiconductor region NPR is provided at any of the bottom portions of the trenches DT1 to DT3 in FIG. 28, the high-concentration n-type semiconductor region NPR may be provided only in a partial region (for example, the trenches DT2 and DT3) of the trenches DT1 to DT3. In such a case, the embedded n-type epitaxial film ENE can also be formed on the sidewalls of all the trenches DT1 to DT3 through autodoping from the high-concentration n-type semiconductor region NPR at each of the bottom portions of the trenches DT2 and DT3.

Third Embodiment

In the second embodiment, the high-concentration n-type semiconductor region NPR is provided, and the tapered embedded n-type epitaxial film ENE is formed using the autodoping phenomenon. However, the tapered embedded n-type epitaxial film ENE may be formed using an autodoping phenomenon from a high-concentration n-type substrate NPS under the trench.

Figure 30:
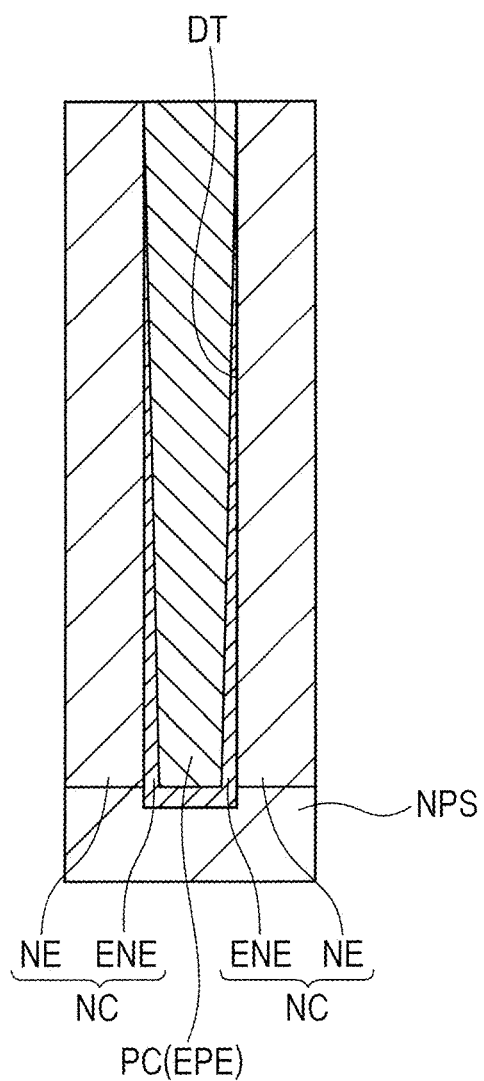
FIG. 30 is an enlarged view of a p-type column region with its vicinity of a third embodiment.

FIG. 30 is an enlarged view of a p-type column region with its vicinity of a third embodiment. FIGS. 31A to 31D are sectional views illustrating a formation process of a superjunction structure of the third embodiment. FIG. 32 is a sectional view illustrating the superjunction structure of the third embodiment. A configuration of a power MOSFET over the superjunction structure, a layout of the p-type column regions, and a layout of the n-type column regions are the same as those in the first embodiment.

In the third embodiment, as shown in FIGS. 30 and 32, the n-type column regions (NC1 to NC3) each have the vertical section including the epitaxial layer NE and the tapered section including the tapered embedded n-type epitaxial film ENE disposed on aside face of the vertical section. The n-type column regions (NC1 to NC3) each have a regular trapezoidal shape in which an upper base is smaller than a lower base. The p-type column regions (PC1 to PC3) each have an inverted trapezoidal shape in which an upper base is larger than a lower base.

In the third embodiment, a bottom face of the trench DT, in which the p-type column region PC is to be disposed, is at a position lower than a surface of the high-concentration n-type substrate (high-concentration As substrate) NPS under the epitaxial layer NE. In other words, the trench DT reaches the high-concentration n-type substrate NPS through the epitaxial layer NE. In this way, even if the film on the side face of the trench DT is formed while the high-concentration n-type substrate NPS is exposed from the bottom of the trench DT, the film is autodoped with the n-type impurity.

For example, as shown in FIG. 31A, the high-concentration n-type substrate NPS having a main surface, on which the epitaxial layer NE including the n-type semiconductor layer is provided, is etched using the hard mask HM having a desired shape as a mask, thereby the trench DT is formed. At this time, the bottom face of the trench DT is located at a position lower than the surface of the high-concentration n-type substrate NPS. In other words, the high-concentration n-type substrate NPS is exposed from the bottom (the bottom face and a lower portion of a side face) of the trench DT. The high-concentration n-type substrate NPS has an n-type impurity concentration higher than at least an n-type impurity concentration of the epitaxial layer NE, for example, about $8.0 \times 10^{15}/cm^3$.

For example, the trench DT has an opening width of about 4 μm and a depth (D) of about 50 μm. The bottom face of the trench DT is located at a position about 1 to 2 μm below the surface of the high-concentration n-type substrate NPS. An angle θ1 between the side face of the trench DT and the surface of the semiconductor substrate (NSP) is 89° to 90°. In this way, the trench DT having a high aspect ratio (10 or more) is formed while providing a substantially vertical angle θ1 between the side face of the trench DT and the surface of the semiconductor substrate NSP. The Bosch process described in the first embodiment is preferably used as an etching process for forming such a trench DT.

Subsequently, as shown in FIG. 31B, the tapered embedded n-type epitaxial film ENE is formed on the side face of the trench DT. For example, an epitaxial layer made of silicon is grown. At this time, the tapered embedded n-type epitaxial film ENE can be formed by introducing a silicon etching gas together with a silicon compound as a source gas. In the third embodiment, since the high-concentration n-type substrate NPS is exposed from the bottom of the trench DT, even if silicon is grown without introducing the n-type impurity, the film on the side face of the trench DT is autodoped with the n-type impurity. Consequently, the tapered embedded n-type epitaxial film ENE can be formed. Even if silicon is grown while a p-type impurity is introduced, since the film on the side face of the trench DT is autodoped with the n-type impurity, the p-type impurity is offset by the n-type impurity. In case of a high autodoping concentration of the n-type impurity, the film on the side face of the trench DT has an n-type conductivity. As the film is further formed on the bottom face of the trench DT, autodoping of the n-type impurity from the high-concentration n-type semiconductor region NPR is gradually suppressed and eventually automatically stopped. In this way, the embedded p-type epitaxial film EPE can be formed within the trench DT while the tapered embedded n-type epitaxial film ENE is formed (FIG. 31C). Specifically, the epitaxial layer is merely grown while the p-type impurity is introduced without switching the impurity to be introduced, which makes it possible to continuously form the tapered embedded n-type epitaxial film ENE with autodoping and the embedded p-type epitaxial film EPE within the trench DT. As described above, the high-concentration n-type substrate NPS has an n-type impurity concentration of, for example, about $8.0\times10^{15}/cm^3$. The tapered embedded n-type epitaxial film ENE formed with autodoping has an n-type impurity concentration of, for example, about $5.0\times10^{15}/cm^3$. The embedded p-type epitaxial film EPE has a p-type impurity concentration of, for example, about $3.0\times10^{15}/cm^3$.

Subsequently, the embedded p-type epitaxial film EPE over the trench DT and the hard mask HM are removed by a CMP process, an etching process, and the like. Consequently, a superjunction structure including the p-type column region PC and the n-type column region NC is formed (see FIG. 32).

As described above, in the third embodiment, autodoping can also be used to easily provide the tapered section including the embedded n-type epitaxial film ENE on the sidewall of each of the trenches DT (DT1 to DT3). As described in detail in the first embodiment, the tapered section including the embedded n-type epitaxial film ENE is provided, thereby the p-type column regions PC1 to PC3 are each allowed to have an inverted trapezoidal shape, leading to an increase in the margin for a variation in the p-type impurity concentration of each of the p-type column regions PC1 to PC3. In addition, on resistance can be reduced by lateral diffusion of the n-type impurity (for example, As).

First Application

The bottom of the embedded p-type epitaxial film EPE shown in FIGS. 30 to 32 is preferably flush with or higher than the surface of the high concentration n-type substrate NPS. In other words, a lower part of the p-type epitaxial film EPE is preferably at a position flush with or higher than the surface of the high concentration n-type substrate NPS. If the depth of the trench DT is deep, or if the high-concentration n-type substrate NPS is etched deep, the bottom of the p-type epitaxial film EPE, i.e., the bottom of the p-type column region PC is disposed at a position lower than the surface of the high-concentration n-type substrate NPS. In such a case, the epitaxial layer EPS is also formed on a stacked portion of the high concentration n-type substrate NPS and the epitaxial layer NE, and becomes more susceptible to the influence of defects of the high concentration n-type substrate NPS having a crystallinity lower than the epitaxial layer NE (for example, having a large number of defects). Hence, the bottom of the p-type column region PC is preferably located at a position flush with or higher than the surface of the high concentration n-type substrate NPS.

Second Application

In the configuration shown in FIGS. 30 to 32, the autodoping phenomenon from the high-concentration n-type substrate NPS under the trench is used, i.e., the high-concentration n-type substrate NPS under the trench is used as the source of the n-type impurity in the embedded n-type epitaxial film ENE. In batch type epitaxial growth, however, a high-concentration n-type substrate NPS serving as a source of the n-type impurity may be disposed in a chamber (processing chamber).

Figure 33:
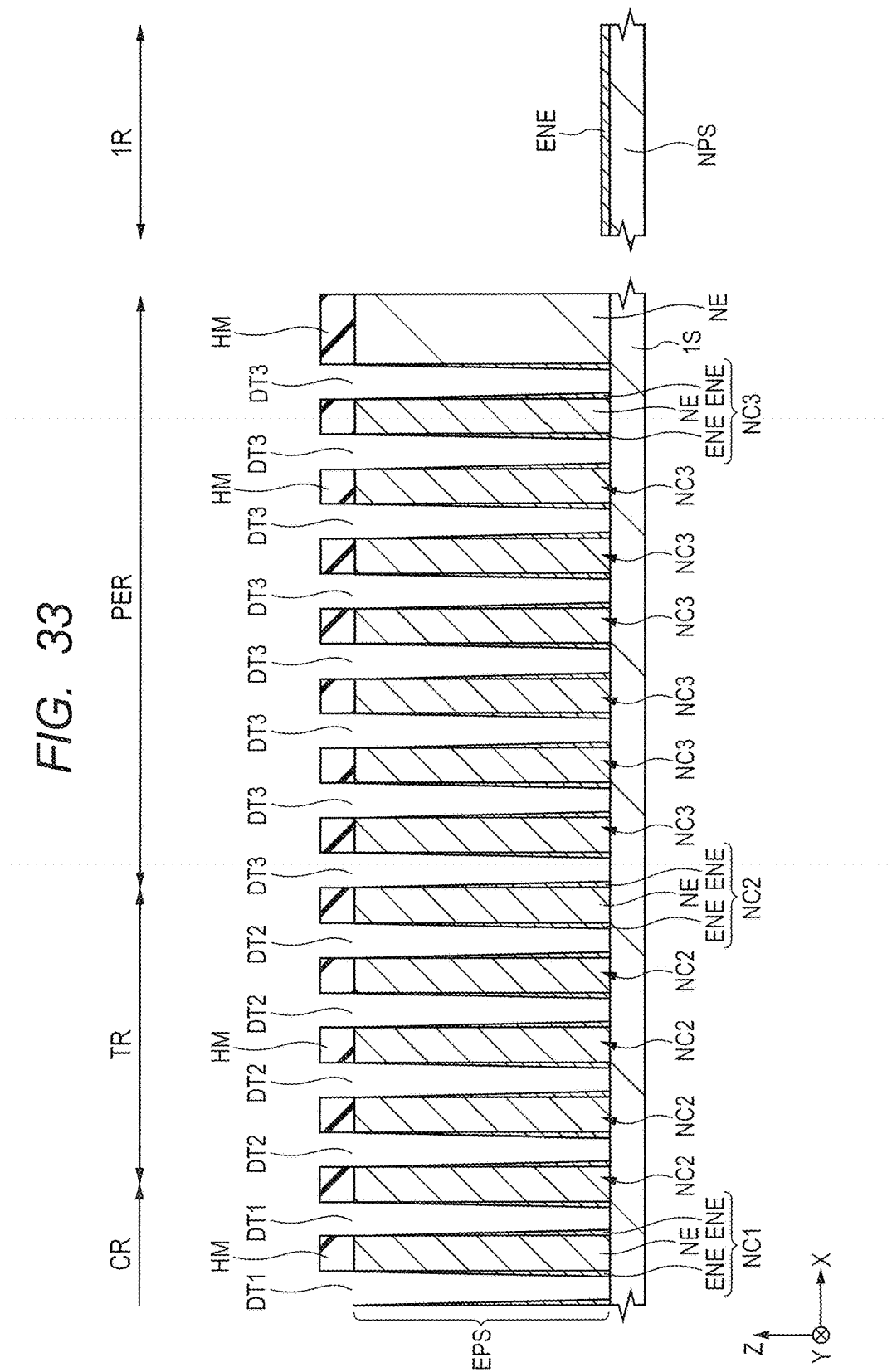
FIG. 33 is a sectional view illustrating a superjunction structure of a second application of the third embodiment.

FIG. 33 is a sectional view illustrating a superjunction structure of the second application of the third embodiment. As shown in FIG. 33, the high-concentration n-type substrate NPS and the semiconductor substrate 1S having the trenches DT are disposed in a chamber (processing chamber), and the tapered embedded n-type epitaxial film ENE is formed on each of the sidewalls of the trenches DT1 to DT3 by using diffusion (autodoping) of the n-type impurity from the high-concentration n-type substrate NPS. For example, an epitaxial layer made of silicon is grown. At this time, the tapered embedded n-type epitaxial film ENE can be formed by introducing a silicon etching gas together with a silicon compound as a source gas. In the second application, since the high-concentration n-type substrate NPS different from a processing substrate is disposed in the chamber (processing chamber), even if silicon is grown without introducing the n-type impurity, the film on the side face of the trench DT is autodoped with the n-type impurity. Consequently, the tapered embedded n-type epitaxial film ENE can be formed.

Even if silicon is grown while a p-type impurity is introduced, since the film on the side face of the trench DT is autodoped with the n-type impurity, the p-type impurity is offset by the n-type impurity. In case of a high autodoping concentration of the n-type impurity, the film on the side face of the trench DT has an n-type conductivity. As the film is further formed on the bottom face of the trench DT, autodoping of the n-type impurity from the high-concentration n-type substrate NPS is gradually suppressed and eventually automatically stopped. In this way, the embedded p-type epitaxial film EPE can be formed within the trench DT while the tapered embedded n-type epitaxial film ENE is formed. Specifically, the epitaxial layer is merely grown while the p-type impurity is introduced without switching the impurity to be introduced, which makes it possible to continuously form the tapered embedded n-type epitaxial film ENE with autodoping and the embedded p-type epitaxial film EPE within the trench DT. The high-concentration n-type substrate NPS has an n-type impurity concentration higher than at least an n-type impurity concentration of the epitaxial layer NE, for example, about $8.0\times10^{15}/cm^3$. The tapered embedded n-type epitaxial film ENE formed with autodoping has an n-type impurity concentration of, for example, about $5.0\times10^{15}/cm^3$. The embedded p-type epitaxial film EPE has a p-type impurity concentration of, for example, about $3.0\times10^{15}/cm^3$.

In FIG. 33, the semiconductor substrate 1S is exposed from the bottom face of the trench DT. However, for example, as shown in FIG. 29, the bottom face of the trench DT may be covered with the embedded n-type epitaxial film ENE. The above-described SEM photographs of FIGS. 11A and 11B are those in the case where the p-type column region and the n-type column region are formed by the process described in the second application.

According to the investigations of the inventors, when an antimony substrate is used as the n-type substrate, and when the embedded p-type epitaxial film (EPE) is formed within each of the trenches DT1, DT2, and DT3 in the state shown in FIG. 13, i.e., in the state where the n-type substrate is exposed from the bottoms of the trenches DT1, DT2, and DT3, no autodoping phenomenon is found. Hence, As is more preferred to be contained as a source (NPR, NPS) of the n-type impurity for autodoping. The impurity concentration of As is preferably $5.0\times10^{15}/cm^3$ or more, and more preferably $8.0\times10^{15}/cm^3$ or more.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

For example, although the MOSFET is described as the semiconductor element provided on the superjunction structure in the above-described embodiments (for example, FIG. 2), the invention can be applied to any semiconductor element including the superjunction structure without limitation. For example, a diode having a p-type semiconductor region and an n-type semiconductor region may be formed as a semiconductor element on the superjunction structure.

Although a taper starting point (tip) of the embedded n-type epitaxial film ENE is located in an upper part of the trench DT as shown in FIG. 34A in the above-described embodiments (for example, FIGS. 5 and 6), the taper starting point (tip) P may be in the middle of the side face of the trench DT. However, the taper starting point (tip) is preferred to be located above at least half of the depth of the trench.

In other words, the p-type column region (PC) is not necessary to have an inverted trapezoidal shape, but should have an upper part width larger than a lower part width. Likewise, the n-type column region (NC) is not necessary to have a trapezoidal shape, but should have an upper part width smaller than a lower part width. The lower part width of the n-type column region (NC) means the length of the n-type semiconductor region located between lower parts of the p-type column regions (PC).

In the above-described embodiments (for example, FIGS. 5 and 6), the semiconductor substrate 1S is exposed from the bottom face of the trench DT. However, the bottom face of the trench DT may be covered with the embedded n-type epitaxial film ENE as shown in FIG. 34B. In the first embodiment (for example, FIG. 5), the semiconductor substrate 1S is exposed from the bottom face of the trench DT. However, the bottom face of the trench DT may be covered with the embedded n-type epitaxial film ENE as shown in FIG. 34C. FIGS. 34A to 34C are sectional views illustrating another example of a configuration of the semiconductor device of the third embodiment. The shape of such a tapered embedded n-type epitaxial film ENE can be adjusted, for example, by regulating an introduction ratio of a silicon compound as a source gas to a silicon etching gas (for example, decreasing a proportion of the etching gas) or a bias potential applied to a processing substrate.

Figure 35:
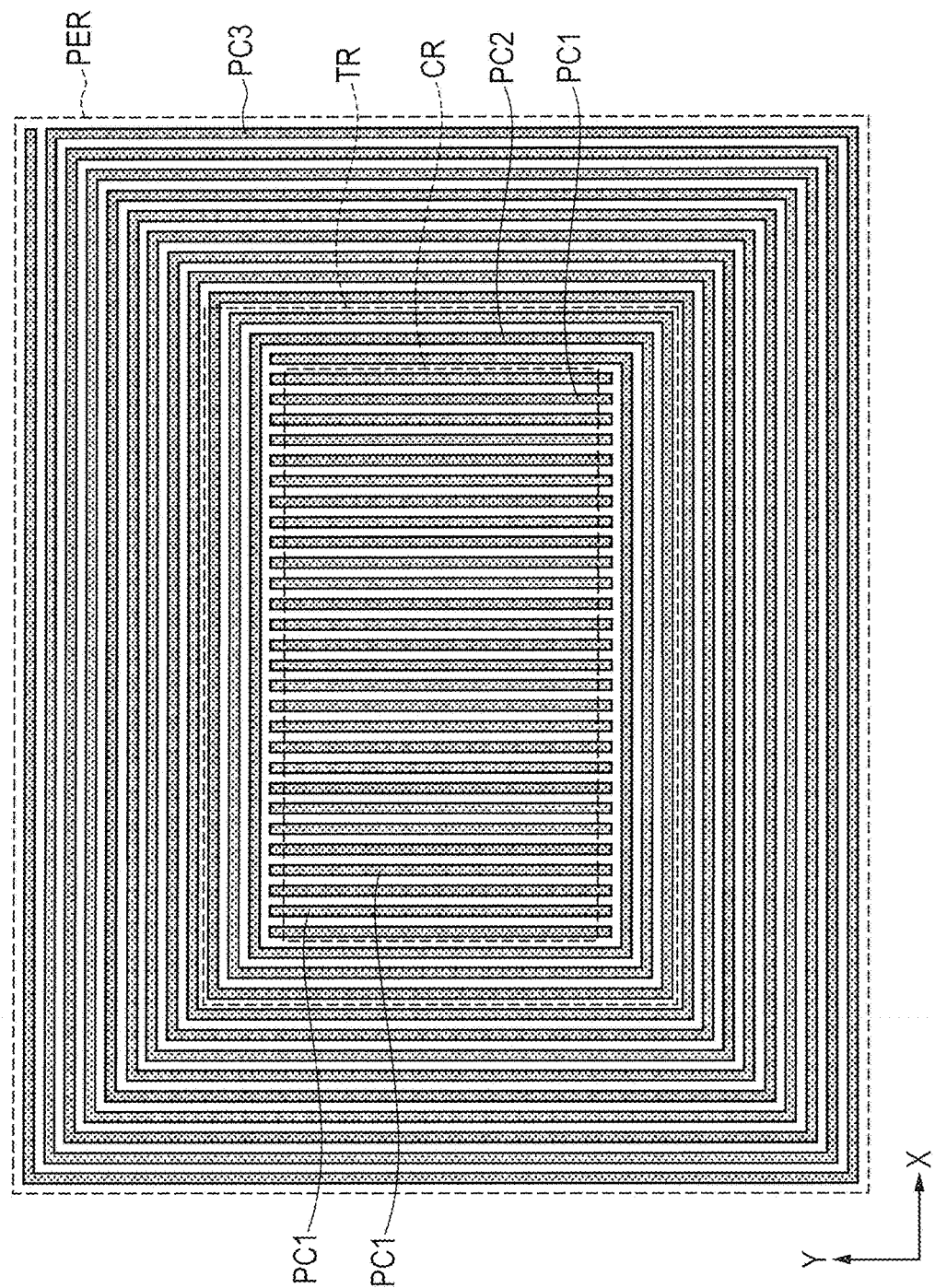
FIG. 35 is a plan view illustrating another example of the configuration of the semiconductor device of the third embodiment.
Figure 36:
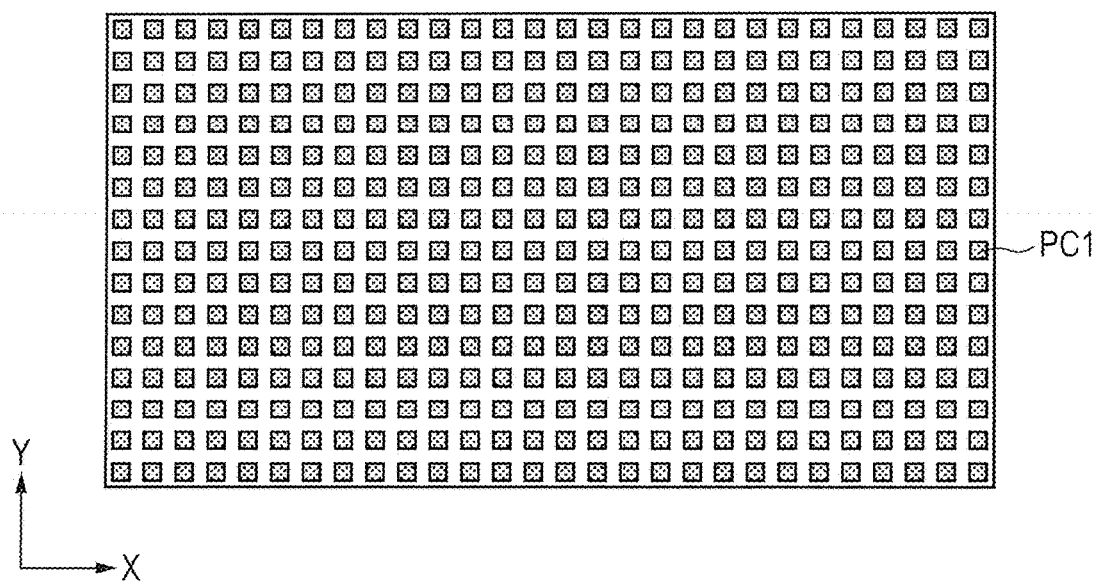
FIG. 36 is a plan view illustrating another example of the configuration of the semiconductor device of the third embodiment.

In the above-described embodiments (for example, FIG. 3), although the p-type column regions PC2 and PC3 in the intermediate region TR and the peripheral region PER each have a linear shape (a rectangular shape having long sides in the X or Y direction), a layout of each of the p-type and n-type column regions (for example, FIG. 3) is not limited thereto. For example, as shown in FIG. 35, the p-type column regions PC2 and PC3 may each have a spiral shape. In addition, as shown in FIG. 36, the p-type column regions PC1 may each have, for example, a quadrangular prism shape of 4 µm square, and may be arranged in an array with a predetermined interval (for example, 4 µm). FIGS. 35 and 36 are each a plan view illustrating another example of the configuration of the semiconductor device of the third embodiment.

What is claimed is:

1. A semiconductor device, comprising:
a semiconductor layer;
a plurality of first pillars having a first conductivity type and a plurality of second pillars having a second conductivity type formed in the semiconductor layer, the second conductivity type being a conductivity type opposite to the first conductivity type;
a plurality of first trenches formed in the semiconductor layer; and
a semiconductor element formed over the semiconductor layer,
wherein the first pillars and the second pillars are alternately arranged,
wherein each of the second pillars includes a first section including the semiconductor layer having the second conductivity type located between the first trenches, and a second section including a tapered embedded semiconductor film having the second conductivity type disposed on a side face of each of the first trenches,
wherein each of the first pillars includes an embedded semiconductor film having the first conductivity type disposed in each of the first trenches,
wherein each of the first pillars has an upper part width larger than a lower part width, and
wherein each of the second pillars has an upper part width smaller than a lower part width.

2. The semiconductor device according to claim 1, wherein an angle between a side face of a first trench of the plurality of first trenches and a bottom face of the semiconductor layer is 89° to 90°.

3. The semiconductor device according to claim 2, wherein an aspect ratio of the first trench is 10 or more.

4. The semiconductor device according to claim 1,
wherein a semiconductor region including an impurity having the second conductivity type is provided in a bottom portion of each of the first trenches, and
wherein concentration of the impurity having the second conductivity type in the semiconductor region is higher than concentration of the impurity having the second conductivity type in the semiconductor layer.

5. The semiconductor device according to claim 1,
wherein the semiconductor layer is provided over a wafer-like substrate having a plurality of chip regions,
wherein a semiconductor region containing an impurity having the second conductivity type is provided in a scribe region disposed between the chip regions of the substrate, and
wherein concentration of an impurity having the second conductivity type in the semiconductor region is higher than concentration of the impurity having the second conductivity type in the semiconductor layer.

6. The semiconductor device according to claim 1,
wherein the semiconductor layer is provided over a wafer-like substrate having a plurality of chip regions,
wherein a semiconductor region containing an impurity having the second conductivity type is provided in a test pattern region as one of the chip regions of the substrate, and
wherein concentration of the impurity having the second conductivity type in the semiconductor region is higher than concentration of the impurity having the second conductivity type in the semiconductor layer.

7. The semiconductor device according to claim 1,
wherein the semiconductor element includes a plurality of unit cells,
wherein each of the unit cells includes:
a gate electrode disposed over a second pillar of the plurality of second pillars with a gate insulating film in between; and
a source region disposed in an upper part of a first pillar of the plurality of first pillars and located on one side of the gate electrode.

* * * * *